United States Patent
Toyota et al.

(10) Patent No.: US 8,160,178 B2
(45) Date of Patent: Apr. 17, 2012

(54) TRANSMITTER

(75) Inventors: Kenji Toyota, Tokyo (JP); Kazuhiko Hikasa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 546 days.

(21) Appl. No.: 12/396,580

(22) Filed: Mar. 3, 2009

(65) Prior Publication Data

US 2009/0225897 A1  Sep. 10, 2009

(30) Foreign Application Priority Data

Mar. 5, 2008  (JP) .................................. 2008-054217

(51) Int. Cl.
 *H04L 27/20* (2006.01)
(52) U.S. Cl. ........ 375/308; 375/345; 375/230; 375/297; 375/373; 375/376
(58) Field of Classification Search .................. 375/345, 375/230, 297, 373, 376, 308
See application file for complete search history.

(56) References Cited

U.S. PATENT DOCUMENTS

| | | | | |
|---|---|---|---|---|
| 4,635,103 | A * | 1/1987 | Steckler et al. ............... | 348/505 |
| 2006/0034364 | A1* | 2/2006 | Breitzmann et al. .......... | 375/238 |
| 2006/0055466 | A1* | 3/2006 | Hirano et al. ................... | 331/16 |

OTHER PUBLICATIONS

Bellaouar; RF Transmitter Architectures for Integrated Wireless Transceivers; The Eleventh International Conference on Microelectronics, 1999, Nov. 22-24, 1999, pp. 25-30.
Brenna et al.; A 2-GHz Carrier Leakage Calibrated Direct-Conversion WCDMA Transmitter in 0.13-μm CMOS; IEEE Journal of Solid-State Circuits, vol. 39, No. 8, Aug. 2004, pp. 1253-1262.

* cited by examiner

*Primary Examiner* — Kabir A Timory
(74) *Attorney, Agent, or Firm* — Mattingly & Malur, PC

(57) ABSTRACT

A transmitter has a transmission modulator including first and second modulators, a phase comparator and a controller. First and second non-inverted local signals supplied to the modulators are set to have a predetermined phase difference. In a calibration action for reducing carrier leakage, the phase comparator is supplied with the first or second local signals, and carrier signals leaking at an output of the transmission modulator. The controller keeps changing the ratio of DC biasing currents to paired transistors of each modulator until the predetermined phase difference is detected with the phase comparator. When the predetermined phase difference is detected, the controller stops changing the ratio of DC biasing currents. The chip footprint of a transmitter on the direct up-conversion (DUC) architecture is reduced, and carrier leakage owing to local signals supplied to the transmission modulator are decreased.

16 Claims, 10 Drawing Sheets

TRANSMITTER

CLAIM OF PRIORITY

The Present application claims priority from Japanese application JP 2008-054217 filed on Mar. 5, 2008, the content of which is hereby incorporated by reference into this application.

FIELD OF THE INVENTION

The present invention relates to a transmitter used in RF communication for mobile phones, wireless LANs and the like, and particularly it relates to a technique useful for reducing the interference by RF signals with local signals supplied to a modulator for transmission.

BACKGROUND OF THE INVENTION

Ubiquitous coverage such that wireless communication can be held anywhere in the world, which is an ability of communication terminal equipment, such as mobile phone terminals, has not been a reality today, but is under development.

Such mobile systems include GSM, GPRS, EDGE, WCDMA, DCS and PCS cellular systems. As to the characteristics of these systems, the demands for multiband and multimode systems, which are arranged by widespread combinations of signals with a fixed envelope and signals with a changing envelope, and of time-division multiplex and code-division multiplex, have been growing. Now, it is noted that GSM stands for "Global System for Mobile Communication", GPRS for "General Packet Radio Service", EDGE for "Enhanced Data for GSM Evolution" or "Enhanced Data for GPRS", WCDMA for "Wideband Code Division Multiple Access", DCS for "Digital Cellular System", and PCS for "Personal Communication System".

A typical two-step transmitter is described in a cited reference presented by Abdellatif Bellaouar, "RF Transmitter Architectures for Integrated Wireless Transceivers", The Eleventh International Conference on Microelectronics, 1999, 22-24 Nov. 1999, pp. 25-30. The typical two-step transmitter has: a quadrature modulator including mixers, a $\pi/2$-phase divider, and an adder: a first band-pass filter; an RF mixer; a buffer amplifier; and a second band-pass filter, in which an output signal from the second band-pass filter is supplied to an RF power amplifier. In such a two-step transmitter, baseband signals I and Q are fed to one input terminal of the two mixers of the quadrature modulator; an intermediate-frequency local signal is supplied to an input terminal of the $\pi/2$-phase divider; and two output signals of the $\pi/2$-phase divider differing in phase by $\pi/2$ (90 degrees) are supplied to the other input terminals of the two mixers. Two output signals from the two mixers are supplied to two input terminals of the adder. Thus, the baseband signals are converted up by the intermediate-frequency local signal to an intermediate frequency of, e.g., 70 MHz. Between an output terminal of the adder of the quadrature modulator and one input terminal of the RF mixer is connected the first band-pass filter for removing harmonics with the intermediate frequency. To the other input terminal of the RF mixer, an RF (Radio Frequency) local signal is supplied. An RF output signal from the RF mixer is amplified by the buffer amplifier, and then fed to the second band-pass filter for removing undesired sidebands. The solution of using a filter to attenuate sidebands of high levels is a very simple and low-power measure, however it is hard to realize such a filter and a physically large off-chip size is required. Further, in the cited reference presented by Abdellatif Bellaouar, a direct up-conversion architecture is also introduced, which can be realized by a smaller number of devices. According to the architecture, baseband signals are directly converted into RF transmit signals with RF local signals supplied to the $\pi/2$-phase divider of the quadrature modulator, and the resultant signals arise at an output of the adder of the quadrature modulator.

In another cited reference presented by Gabriel Brenna et al, "A 2-GHz Carrier Leakage Calibrated Direct-Conversion WCDMA Transmitter in 0.13-·m CMOS", IEEE JOURNAL OF SOLID-STATE CIRCUITS, VOL. 39, No. 8, AUGUST 2004, pp. 1253-1262, a DUC architecture is introduced as a hopeful candidate for a highly integrated transmitter in that costly external parts are eliminated. Herein, DUC stands for direct up-conversion. According to the DUC transmitter architecture, a transmit baseband signal I/Q is supplied to an I/Q modulator through a baseband filter. The I/Q modulator converts the transmit baseband signals to a radio frequency (RF). At the radio frequency, the signals I and Q are synthesized and amplified. After going through external filtering and additional amplification, the resultant signal is supplied to a duplexer, and then launched through an antenna. To reduce the oscillator frequency pulling into outputs of a power amplifier (PA), the local oscillator (LO) is set to 4 GHz, which is double the carrier frequency. A digital divider is used to generate a precise 2-GHz quadrature local signal.

Further, according to the cited reference presented by Gabriel Brenna et al., carrier leakage is pointed out as a serious drawback which DUC architecture has. The carrier leakage produces interference signals of about 1.9 GHz, which fall in the frequency band of WCDMA signals ranging from 1.895 to 1.905 GHz. The carrier leakage can cause EVM (Error Vector Magnitude) and ACPR (Adjacent Channel Power Ratio) to exceed the values stated in the specifications. According to the cited reference presented by Gabriel Brenna et al., offset calibration is adopted in order to suppress the carrier leakage, in which two operational amplifiers of the baseband filter use a 6-bit current source. Also, according to the cited reference presented by Gabriel Brenna et al., carrier leakage calibration is embraced to suppress carrier leakage, in which a 5-bit binary weighted current source is used for the I/Q modulator. The power of carrier leakage is detected by an on-chip power detector with no transmit signal. Analog output voltages from the detector are converted into digital signals by use of an automatic digital calibration algorithm. The algorithm controls a calibration circuit for the modulator and baseband filter so as to minimize the measured carrier leakage.

SUMMARY OF THE INVENTION

As described in the cited reference presented by Gabriel Brenna et al., the leakage of carrier signals into a frequency band of transmit signals of a transceiver must be made as small as possible in an RF semiconductor integrated circuit for communication, hereinafter referred to as "communication RF IC".

Prior to the invention, the inventors were engaged in the development of a communication RF IC which enables communication according to a WCDMA system, in which it was examined to adopt the direct up-conversion architecture for the transmitter of the communication RF IC.

FIG. 1 shows a transmitter of the communication RF IC based on the direct up-conversion architecture, which was examined prior to the invention. As in the drawing, the transmission modulator 10, which is incorporated in the transmitter, includes a first modulator 1 and a second modulator 2.

The first modulator 1 includes N-channel MOS transistors M11 and M21 and NPN bipolar transistors Q11, Q21, Q31 and Q41. A first non-inverted baseband signal $I_{in}$ and a first inverted baseband signal $/I_{in}$ are supplied to the gate of the MOS transistor M11 and the gate of the MOS transistor M21, respectively. The sources of the MOS transistors M11 and M21 are connected to a ground potential GND through respective resistances R11 and R21. A first non-inverted local signal LoI of RF frequency is supplied to the bases of the transistors Q11 and Q31, whereas a first inverted local signal /LoI of RF frequency is fed to the bases of the transistors Q21 and Q41. The drain of the MOS transistor M11 is connected with the emitters of the transistors Q11 and Q21. The drain of the MOS transistor M21 is connected with the emitters of the transistors Q31 and Q41. The collectors of the transistors Q11 and Q41 are connected to a source voltage Vcc through a load resistance $R_{L1}$. The collectors of the transistors Q21 and Q31 are connected to the source voltage Vcc through a load resistance $R_{L2}$.

The second modulator 2 includes N-channel MOS transistors M12 and M22, and NPN bipolar transistors Q12, Q22, Q32 and Q42. A second non-inverted baseband signal $Q_{in}$ and a second inverted baseband signal $/Q_{in}$ are supplied to the gate of the MOS transistor M12 and the gate of the MOS transistor M22, respectively. The sources of the MOS transistors M12 and M22 are connected to the ground potential GND through respective resistances R12 and R22. A second non-inverted local signal LoQ of RF frequency is supplied to the bases of the transistors Q12 and Q32. A second inverted local signal /LoQ of RF frequency is supplied to the bases of the transistors Q22 and Q42. The drain of the MOS transistor M12 is connected to the emitters of the transistors Q12 and Q22. The drain of the MOS transistor M22 is connected to the emitters of the transistors Q32 and Q42. The collectors of the transistors Q12 and Q42 are connected to the source voltage Vcc through the load resistance $R_{L1}$, and the collectors of the transistors Q22 and Q32 are connected to the source voltage Vcc through the load resistance $R_{L2}$.

The phase of the first non-inverted local signal LoI of RF frequency supplied to the first modulator 1 is 0°, and that of the second non-inverted local signal LoQ of RF frequency supplied to the second modulator 2 is 90°. Therefore, the transmission modulator 10 including the first and second modulators 1 and 2 works as a quadrature modulator. Specifically, in the first modulator 1, direct up-conversion from the first baseband signals $I_{in}$ and $/I_{in}$ to the first RF transmit signals is performed using the first local signals LoI and /LoI with RF frequency and the phase 0°. In the second modulator 2, direct up-conversion from the second baseband signals $Q_{in}$ and $/Q_{in}$ to the second RF transmit signals is performed using the second local signals LoQ and /LoQ with RF frequency and the phase 90°. The first RF transmit signals from the first modulator 1 and the second RF transmit signals from the second modulator 2 undergo vector syntheses by the load resistances $R_{L1}$ and $R_{L2}$, whereby RF transmit signals $MOD_{out}$ and $/MOD_{out}$ are produced. The RF transmit signals $MOD_{out}$ and $/MOD_{out}$ resulting from the vector syntheses are amplified by an RF power amplifier (PA), and then sent out to a base station through an antenna.

However, in the transmission modulator 10 of the transmitter of a communication RF IC based on the direct up-conversion architecture shown in FIG. 1 and examined prior to the invention, the leakage of carrier signals in a frequency band of transmit signals of the transmitter is caused according to a mechanism as described below. The leakage of carrier signals is attributed to asymmetry of the circuits of the first and second modulators 1 and 2 of the transmission modulator 10. The first modulator 1 has a symmetric circuit. Also, the second modulator 2 has a symmetric circuit. As long as a perfect pair comparableness of a pair of devices, i.e., for the paired devices, the property of being perfectly comparable to each other in function or physical quantity, is achieved as to the first and second modulators 1 and 2, each constituting a symmetric circuit, the leakage of carrier signals is never caused.

In the case that in the first modulator 1, the pair comparableness cannot be ensured with regard to at least one of the pair of MOS transistors M11 and M21 and the pair of resistances R11 and R21, the leakage of carrier signals occurs. Specifically, in the case that the pair comparableness of the MOS transistors M11 and M21 cannot be ensured in DC biasing current, the leakage of carrier signals arises. Also, in the case that the pair comparableness in base-collector capacitance cannot be ensured as to at least one of the pair of transistors Q11 and Q41 and the pair of transistors Q21 and Q31, the leakage of carrier signals occurs.

Further, in the case that in the second modulator 2, the pair comparableness cannot be ensured with regard to at least one of the pair of MOS transistors M12 and M22 and the pair of resistances R12 and R22, the leakage of carrier signals occurs. Specifically, in the case that the pair comparableness of the MOS transistors M12 and M22 cannot be ensured in DC biasing current, the leakage of carrier signals arises. Also, in the case that the pair comparableness in base-collector capacitance cannot be ensured as to at least one of the pair of transistors Q12 and Q42 and the pair of transistors Q22 and Q32, the leakage of carrier signals occurs. The imbalance of the base-collector capacitance between paired transistors in terms of the pair comparableness can be attributed to the imbalance in layout design of the transistors of the first and second modulators 1 and 2 of the transmission modulator 10 in the RF IC, the variation between the manufacturing processes of the RF IC, the imbalance owing to the temperature dependence of the RF IC, and other factors.

The carrier signal leakage from each transistor owing to the base-collector capacitance thereof is indicated by an arrow in FIG. 1; as to each pair of transistors, the larger leakage is represented by an arrow with a solid line, whereas the smaller leakage is represented by an arrow with a broken line. Specifically, in the first modulator 1, the carrier signal leakage coming from the first non-inverted local signal LoI through the capacitance of the transistor Q11 and reaching the non-inverted RF transmit signal terminal $MOD_{out}$ is larger than the carrier signal leakage coming from the first inverted local signal /LoI through the capacitance of the transistor Q41 and reaching the non-inverted RF transmit signal terminal $MOD_{out}$. Further, in the first modulator 1, the carrier signal leakage coming from the first non-inverted local signal LoI through the capacitance of the transistor Q31 and reaching the inverted RF transmit signal terminal $/MOD_{out}$ is larger than the carrier signal leakage coming from the first inverted local signal /LoI through the capacitance of the transistor Q21 and reaching the inverted RF transmit signal terminal $/MOD_{out}$.

Turning to the second modulator 2, in which the carrier signal leakage coming from the second non-inverted local signal LoQ through the capacitance of the transistor Q12 and reaching the non-inverted RF transmit signal terminal $MOD_{out}$ is larger than the carrier signal leakage coming from the second inverted local signal /LoQ through the capacitance of the transistor Q42 and reaching the non-inverted RF transmit signal terminal $MOD_{out}$. Further, in the second modulator 2, the carrier signal leakage coming from the second non-inverted local signal LoQ through the capacitance of the transistor Q32 and reaching the inverted RF transmit signal terminal /MOD$_{out}$ is larger than the carrier signal leakage coming from the second inverted local signal /LoQ through the capacitance of the transistor Q22 and reaching the inverted RF transmit signal terminal /MOD$_{out}$.

FIGS. 2A, 2B and 2C are diagrams of assistance in explaining the way the leakage of carrier signals occurs in the transmitter of the communication RF IC based on the direct up-conversion architecture shown in FIG. 1.

FIG. 2C shows frequency spectra of baseband signals I and Q according to a WCDMA system. The frequency bandwidth f_BB of baseband signals according to WCDMA system is about 2 MHz, which belongs to relatively high frequencies. FIG. 2B shows frequency spectra of local signals LoI and LoQ. As in the drawing, the frequency band f_RF of the local signals according to a WCDMA system is about 2 GHz, which belongs to radio frequencies (RF). FIG. 2A shows frequency spectra of RF transmit signals MOD$_{out}$ and /MOD$_{out}$, in which the RF transmit signals MOD$_{out}$ and /MOD$_{out}$ have their center at an RF frequency f_RF, and a frequency band 2•f_BB, which is double the frequency bandwidth of the baseband signals, and include a carrier signal leakage CL with the frequency f_RF. The carrier signal leakage CL having the frequency f_RF can cause EVM (Error Vector Magnitude) and ACPR (Adjacent Channel Power Ratio) to exceed the values stated in the specifications, as described in the cited reference presented by Gabriel Brenna et al.

Further, in the cited reference presented by Gabriel Brenna et al., an on-chip power detector of a wide dynamic range for detecting a carrier leakage power with no transmit signal is described. The power detector includes a chain of eight capacitively coupled amplifiers each having a gain of 10 dB. To an input of the chain, an additional low-noise amplifier (LNA) is connected. Outputs from the nine amplifiers are supplied to inputs of nine detector cells which perform the full wave rectification on differential RF signals. Outputs from the nine detector cells are fed to inputs of nine low-pass filters (LPF). Outputs from the nine low-pass filters (LPF) are supplied to an adder circuit. In this way, a calibration circuit for the modulator and baseband filter can be controlled so as to minimize the carrier leakage by using the on-chip power detector with a wide dynamic range as described in the cited reference presented by Gabriel Brenna et al.

However, it was clarified from the examination by the inventors that the on-chip power detector as described in the cited reference presented by Gabriel Brenna et al. had a problem that the chip footprint of the on-chip power detector in the RF IC was extremely large because the detector included the chain of nine amplifiers capacitively coupled to achieve a wide dynamic range. Particularly, the number of coupled capacitances and the number of capacitances of the low-pass filters (LPF) were both large, which remarkably enlarged the chip footprint of the on-chip power detector.

The invention was made by the inventors after the examination prior to the invention as described above. Hence, it is an object of the invention to provide a transmitter which enables a reduction in the chip footprint in integration into a semiconductor integrated circuit and a decrease in the carrier leakage owing to local signals supplied to its transmission modulator.

The above and other objects and novel features of the invention will be apparent from the description hereof and the accompanying drawings.

Of the forms of a transmitter hereby disclosed, preferred ones will be described below in brief.

A transmitter according to a preferred form of the invention has: a transmission modulator (10) including a first modulator (1) and a second modulator (2); a phase comparator (11); and a controller (13).

A first non-inverted local signal (LoI) and a second non-inverted local signal (LoQ) supplied to the first modulator (1) and second modulator (2) of the transmission modulator (10) are set to have a predetermined phase difference.

In a calibration action for reducing carrier leakage, the phase comparator (11) is supplied with a pair of a first non-inverted local signal (LoI) and a first inverted local signal (/LoI) or a pair of a second non-inverted local signal (LoQ) and a second inverted local signal (/LoQ), and a leaked carrier signal arising at an output terminal of the transmission modulator (10). The controller (13) keeps changing a ratio of DC biasing currents to each pair of transistors (M11, M21 or M12, M22) of the modulator (1 or 2) until the predetermined phase difference is detected with the phase comparator (11) (see FIG. 3).

The effect brought about by the preferred forms of a transmitter hereby disclosed will be described below in brief. That is, it is possible to provide a transmitter which enables a reduction in the chip footprint in integration into a semiconductor integrated circuit and a decrease in the carrier leakage owing to local signals supplied to its transmission modulator.

DETAILED DESCRIPTION OF THE PREFERRED EMBODIMENTS

1. Summary of the Preferred Embodiments

Figure 1:
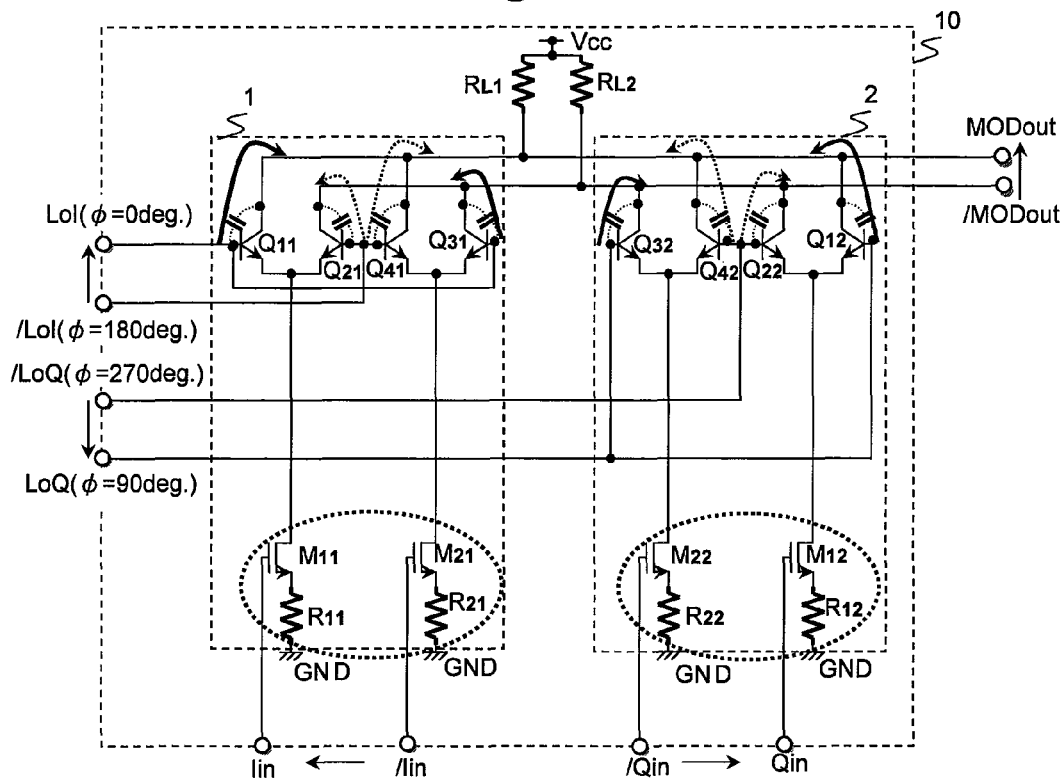
FIG. 1 is a diagram showing a transmitter of a communication RF IC based on the direct up-conversion architecture, which was examined prior to the invention.
Figure 2A:
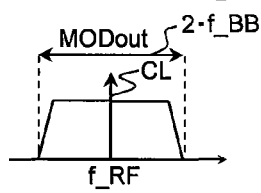
FIGS. 2A, 2B and 2C are diagrams of assistance in explaining the way the leakage of carrier signals occurs in the transmitter of the communication RF IC based on the direct up-conversion architecture shown in FIG. 1.
Figure 2B:
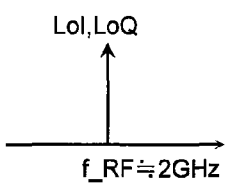
Figure 2C:
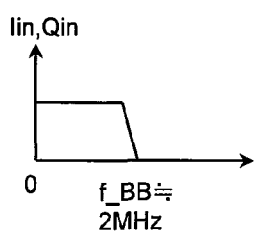

The preferred embodiments of the invention hereby disclosed will be outlined first. Here, the reference numerals and characters to refer to the drawings, which are accompanied with paired round brackets, only exemplify what the concepts of constituents referred to by the numerals and characters contain.

[1] A transmitter according to a preferred embodiment of the invention has: a transmission modulator (10) including a first modulator (1) and a second modulator (2); a phase comparator (11); and a controller (13).

At a time of transmission, the first modulator (1) is supplied with a pair of a first non-inverted baseband signal ($I_{in}$) and a first inverted baseband signal ($/I_{in}$), and a pair of a first non-inverted local signal (LoI) and a first inverted local signal (/LoI).

On the other hand, at the time of transmission, the second modulator (2) is supplied with a pair of a second non-inverted baseband signal ($Q_{in}$) and a second inverted baseband signal ($/Q_{in}$), and a pair of a second non-inverted local signal (LoQ) and a second inverted local signal (/LoQ).

At the time of transmission, a first RF transmit signal from the first modulator (1), and a second RF transmit signal from the second modulator (2) undergo vector syntheses, whereby a pair of RF transmit signals $MOD_{out}$ and $/MOD_{out}$ is produced and output through an output terminal of the transmission modulator (10).

The first non-inverted local signal (LoI) and second non-inverted local signal (LoQ) are set to have a predetermined phase difference. In the case that a phase difference ($\Delta\phi$) between input signals to the first differential input terminal (V1) and second differential input terminal (V2) of the phase comparator (11) reaches the predetermined phase difference, a phase conversion output signal ($V_{PD}$) produced by the phase comparator (11) is brought to a predetermined detection state ($V_M$) in response to this event (see FIG. 4).

The controller (13) executes a calibration action for reducing carrier leakage associated with the first modulator (1) and a calibration action for reducing carrier leakage associated with the second modulator (2) in response to a calibration instruction.

In the calibration action for the first modulator (1), the phase comparator (11) is supplied with the pair of first non-inverted local signal (LoI) and first inverted local signal (/LoI), and a leaked carrier signal arising at an output terminal of the transmission modulator (10).

The first modulator (1) includes a first pair of transistors (M11, M21), which are supplied with the first non-inverted baseband signal ($I_{in}$) and first inverted baseband signal ($/I_{in}$) respectively at the time of transmission. In the calibration action for the first modulator, the controller keeps changing a ratio of DC biasing currents to the first pair of transistors (M11, M21) of the first modulator until the phase comparator (11) produces the phase conversion output signal ($V_{PD}$) of the predetermined detection state ($V_M$); the controller stops changing the ratio of DC biasing currents to the first pair of transistors of the first modulator at a time when the phase comparator (11) produces the phase conversion output signal ($V_{PD}$) of the predetermined detection state ($V_M$).

In the calibration action for the second modulator (2), the phase comparator (11) is supplied with the pair of second non-inverted local signal (LoQ) and second inverted local signal (/LoQ) and a leaked carrier signal arising at the output terminal of the transmission modulator (10).

The second modulator (2) includes a second pair of transistors (M12, M22), which are supplied with the second non-inverted baseband signal ($Q_{in}$) and second inverted baseband signal ($/Q_{in}$) at the time of transmission. In the calibration action for the second modulator, the controller keeps changing a ratio of DC biasing currents to the second pair of transistors (M12, M22) of the second modulator until the phase comparator (11) produces the phase conversion output signal ($V_{PD}$) of the predetermined detection state ($V_M$); the controller stops changing the ratio of DC biasing currents to the second pair of transistors of the second modulator at a time when the phase comparator (11) produces the phase conversion output signal ($V_{PD}$) of the predetermined detection state ($V_M$) (see FIG. 3).

According to the above embodiment, a condition for minimizing the carrier leakage associated with the first modulator (1) can be achieved at a time when in the calibration action for the first modulator (1), the phase comparator (11) produces the predetermined detection state ($V_M$) and then the controller stops changing the ratio of DC biasing currents to the first pair of transistors. Further, a condition for minimizing the carrier leakage associated with the second modulator (2) can be achieved at a time when in the calibration action for the second modulator (2), the phase comparator (11) produces the predetermined detection state ($V_M$) and then the controller stops changing the ratio of DC biasing currents to the second pair of transistors.

Therefore, according to this embodiment, a condition for minimizing the carrier leakage can be achieved by using the phase comparator (11) small in its chip footprint without using an on-chip power detector requiring an extremely large chip footprint as described in the cited reference presented by Gabriel Brenna et al. Thus, the footprint of chip in integration into a semiconductor integrated circuit can be made smaller, and a transmitter which enables the reduction in carrier leakage coming from local signals supplied to the transmission modulator can be made.

The transmitter according to another preferred embodiment further includes a first D/A converter (14) and a second D/A converter (15).

The first D/A converter (14) is used to change the ratio of DC biasing currents to the first pair of transistors (M11, M21) of the first modulator (1), whereas the second D/A converter (15) is used to change the ratio of DC biasing currents to the second pair of transistors (M12, M22) of the second modulator (2).

The controller (13) includes a first control register for controlling the first D/A converter (14), and a second control register for controlling the second D/A converter (15).

In an early stage of the calibration action for the first modulator (1), a digital value of the first control register of the controller (13) is set to an initial value such that the DC biasing currents to the first pair of transistors (M11, M21) of the first modulator (1) are substantially equalized to each other. In the calibration action for the first modulator, the controller keeps updating the digital value of the first control register until the phase comparator (11) produces the phase conversion output signal ($V_{PD}$) of the predetermined detection state ($V_M$); the controller stops updating the digital value of the first control register at a point when the phase comparator (11) produces the phase conversion output signal ($V_{PD}$) of the predetermined detection state ($V_M$) (see Steps 72 to 74 of FIG. 7).

In an early stage of the calibration action for the second modulator (2), a digital value of the second control register of the controller (13) is set to an initial value such that the DC biasing currents to the second pair of transistors (M12, M22) of the second modulator (2) are substantially equalized to each other. In the calibration action for the second modulator, the controller keeps updating the digital value of the second control register until the phase comparator (11) produces the phase conversion output signal ($V_{PD}$) of the predetermined detection state ($V_M$); the controller stops updating the digital value of the second control register at a point when the phase comparator (11) produces the phase conversion output signal ($V_{PD}$) of the predetermined detection state ($V_M$) (see Steps 75 to 77 of FIG. 7).

In the transmitter according to another preferred embodiment, the digital value of the first control register at the time when the controller stops updating the digital value of the first control register in the calibration action for the first modulator is a piece of control digital information which minimizes the carrier leakage associated with the first modulator. The digital value of the second control register at the time when the controller stops updating the digital value of the second control register in the calibration action for the second modulator is a piece of control digital information which minimizes the carrier leakage associated with the second modulator.

In the transmitter according to a more preferred embodiment, the phase comparator (11) is composed of a double-balanced analog phase comparator circuit (Q1-Q6, R1, R2, C1, C2). Further, in the transmitter, the phase conversion output signal ($V_{PD}$) arising from a differential output terminal of the double-balanced analog phase comparator circuit is supplied to a differential input terminal of a voltage comparator (12); a comparative output signal ($V_{CMP}$) from the voltage comparator (12) is supplied to the controller (13) (see FIG. 12).

The transmitter according to another more preferred embodiment further includes a first limiter amplifier (18) and a second limiter amplifier (19).

To a pair of differential input terminals of the first limiter amplifier (18), the pair of first non-inverted local signal (LoI) and first inverted local signal (/LoI), and the pair of second non-inverted local signal (LoQ) and second inverted local signal (/LoQ) are supplied selectively. An output signal from a differential output terminal of the first limiter amplifier (18) is transmitted to the first differential input terminal (V1) of the phase comparator (11).

To a pair of differential input terminals of the second limiter amplifier (19), the leaked carrier signals arising at the output terminals of the transmission modulator (10) are supplied. An output signal from a differential output terminal of the second limiter amplifier (19) is transmitted to the second differential input terminal (V2) of the phase comparator (11).

The transmitter according to a still more preferred embodiment further includes a first delay regulator (20) and a second delay regulator (21).

The first delay regulator (20) is connected between the pair of differential output terminals of the first limiter amplifier (18), and the first differential input terminal (V1) of the phase comparator (11).

Figure 8:
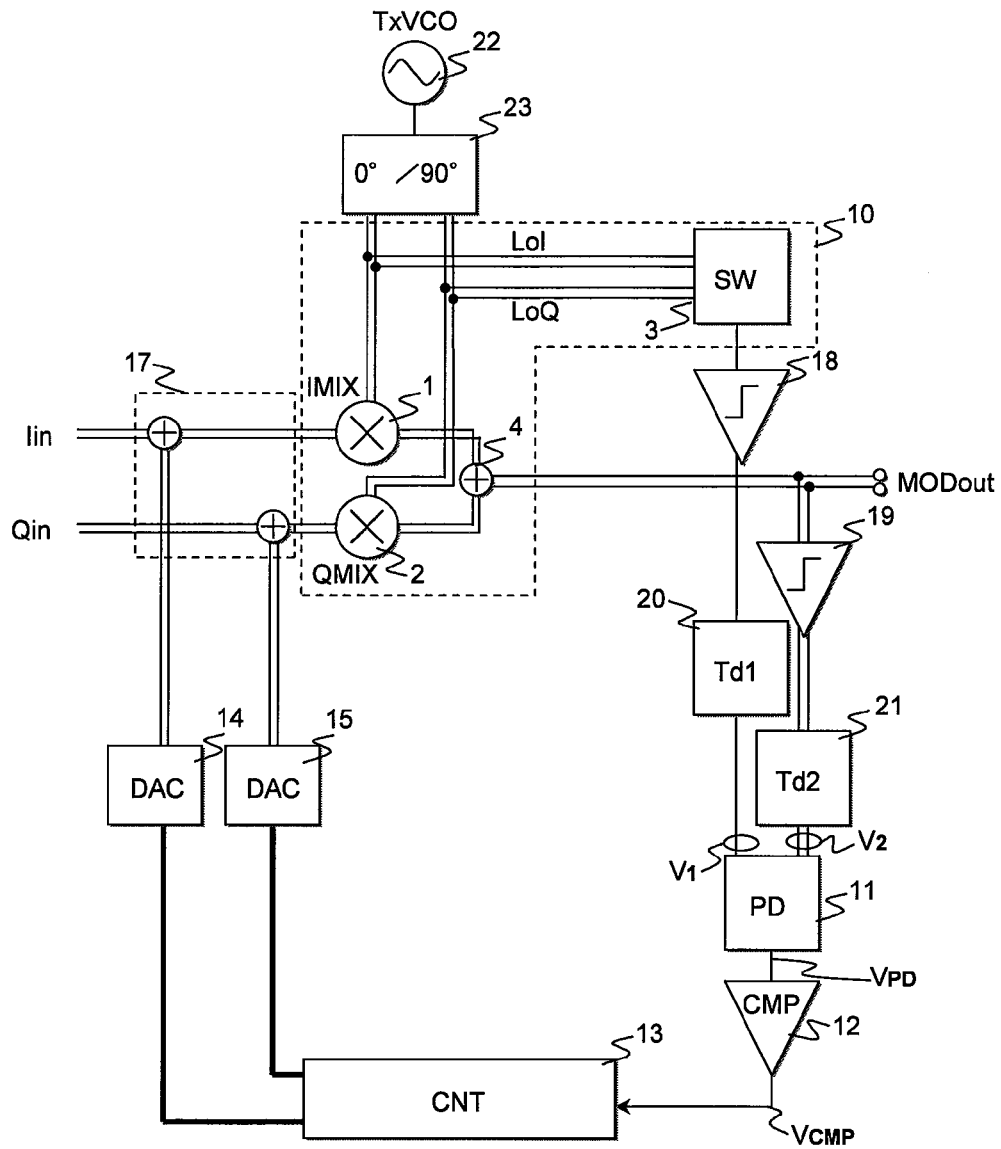
FIG. 8 is a diagram showing an improved transmitter of a communication RF IC based on the direct up-conversion architecture according to another embodiment of the invention.

The second delay regulator (21) is connected between the pair of differential output terminals of the second limiter amplifier (19), and the second differential input terminal (V2) of the phase comparator (11) (see FIG. 8).

Figure 3:
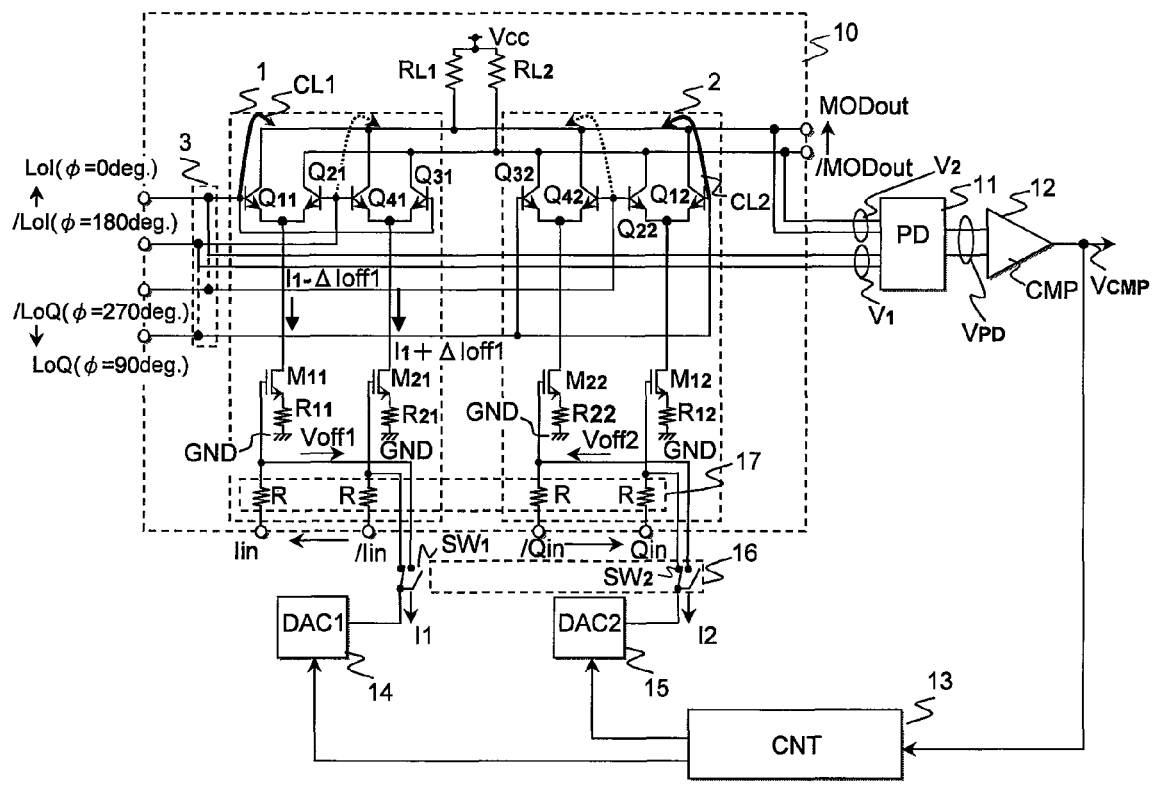
FIG. 3 is a diagram showing a transmitter of a communication RF IC based on the direct up-conversion architecture according to an embodiment of the invention.

According to a specific embodiment, the predetermined phase difference is about 90°, and the transmission modulator (10) including the first modulator (1) and the second modulator (2) works as a quadrature modulator (see FIG. 3).

According to the most specific embodiment, the transmission modulator (10) including the first modulator (1) and the second modulator (2) is of a type used for a transmitter based on a direct up-conversion (DUC) architecture. The transmitter based on DUC architecture transmits an RF transmit signal according to at least one system of GSM850, GSM900, DCS1800, PCS1900, and Band1, Band2 and Band5 of WCDMA to a base station (see FIGS. 14 and 15).

[2] A transmitter according to a preferred embodiment based on another aspect of the invention has: a transmission modulator (10) including a first modulator (1) and a second modulator (2); a phase comparator (11); and a controller (13).

The first modulator (1) includes a first transistor (M11), a second transistor (M21), a third transistor (Q11), a fourth transistor (Q21), a fifth transistor (Q41), and a sixth transistor (Q31).

In the first modulator (1), a first non-inverted baseband signal ($I_{in}$) is supplied to an input terminal of the first transistor (M11), and a first inverted baseband signal (/$I_{in}$) is supplied to an input terminal of the second transistor (M21) at a time of transmission.

In the first modulator (1), an output terminal of the first transistor (M11) is commonly connected with a common terminal of the third transistor (Q11) and a common terminal of the fourth transistor (Q21), and an output terminal of the second transistor (M21) is commonly connected with a common terminal of the fifth transistor (Q41) and a common terminal of the sixth transistor (Q31).

In the first modulator (1), a first non-inverted local signal (LoI) is commonly supplied to an input terminal of the third transistor (Q11) and an input terminal of the sixth transistor (Q31), whereas a first inverted local signal (/LoI) is commonly supplied to an input terminal of the fourth transistor (Q21) and an input terminal of the fifth transistor (Q41).

The second modulator (2) includes a seventh transistor (M12), an eighth transistor (M22), a ninth transistor (Q12), a tenth transistor (Q22), an eleventh transistor (Q42) and a twelfth transistor (Q32).

In the second modulator (2), a second non-inverted baseband signal ($Q_{in}$) is supplied to an input terminal of the seventh transistor (M12), and a second inverted baseband signal (/$Q_{in}$) is supplied to an input terminal of the eighth transistor (M22), at the time of transmission.

In the second modulator (2), an output terminal of the seventh transistor (M12) is commonly connected with a common terminal of the ninth transistor (Q12) and a common terminal of the tenth transistor (Q22), and an output terminal of the eighth transistor (M22) is commonly connected with a common terminal of the eleventh transistor (Q42) and a common terminal of the twelfth transistor (Q32).

In the second modulator (2), a second non-inverted local signal (LoQ) is commonly supplied to an input terminal of the ninth transistor (Q12) and an input terminal of the twelfth transistor (Q32), whereas a second inverted local signal (/LoQ) is commonly supplied to an input terminal of the tenth transistor (Q22) and an input terminal of the eleventh transistor (Q42).

In the transmission modulator (10), a first non-inverted RF transmit signal ($MOD_{out}$) arises from output terminals of the third transistor (Q11) and fifth transistor (Q41) of the first modulator (1), and output terminals of the ninth transistor (Q12) and eleventh transistor (Q42) of the second modulator (2).

In the transmission modulator (10), a first inverted RF transmit signal (/$MOD_{out}$) arises from output terminals of the fourth transistor (Q21) and sixth transistor (Q31) of the first modulator (1), and output terminals of the tenth transistor (Q22) and twelfth transistor (Q32) of the second modulator (2).

The first non-inverted local signal (LoI) and second non-inverted local signal (LoQ) are set to have a predetermined phase difference.

The pair of first non-inverted local signal (LoI) and first inverted local signal (/LoI) supplied to the first modulator (1), and the pair of second non-inverted local signal (LoQ) and second inverted local signal (/LoQ) supplied to the second modulator (2) can be supplied to a first differential input terminal (V1) of the phase comparator (11) selectively.

The first non-inverted RF transmit signal ($MOD_{out}$) and first inverted RF transmit signal (/$MOD_{out}$) produced by the transmission modulator (10) can be supplied to a second differential input terminal (V2) of the phase comparator (11) (see FIG. 3).

Figure 4:
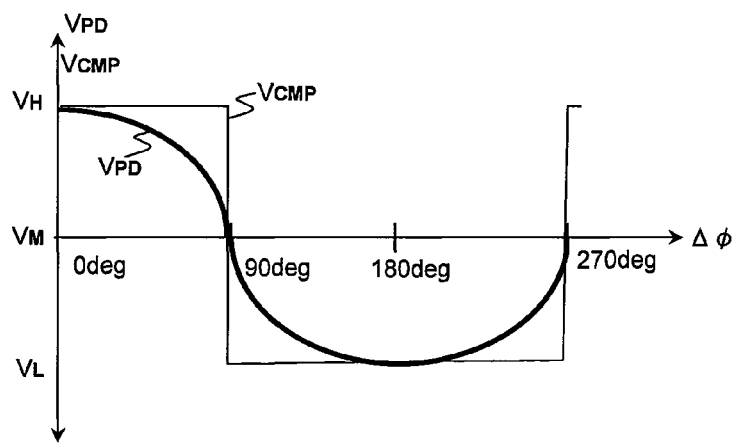
FIG. 4 is a diagram showing the change in a phase conversion output signal from a phase comparator, and the change in a comparative output signal from a voltage comparator in response to a phase difference between input signals to the first and second differential input terminals of the phase comparator in the transmitter shown in FIG. 3.

In the case that a phase difference ($\Delta\phi$) between input signals to the first differential input terminal (V1) and second differential input terminal (V2) of the phase comparator (11) reaches a predetermined phase difference, a phase conversion output signal ($V_{PD}$) produced by the phase comparator (11) is brought to a predetermined detection state ($V_M$) in response to this event (see FIG. 4).

The controller (13) executes a calibration action for reducing carrier leakage associated with the first modulator (1) and a calibration action for reducing carrier leakage associated with the second modulator (2) in response to a calibration instruction.

In the calibration action for reducing carrier leakage associated with the first modulator, the first non-inverted local signal (LoI) and first inverted local signal (/LoI) are supplied to the first differential input terminal (V1) of the phase comparator (11).

On the other hand, in the calibration action for the first modulator, carrier signals leaking at a first non-inverted RF transmit output terminal ($MOD_{out}$) and a first inverted RF transmit output terminal (/$MOD_{out}$) of the transmission modulator (10) are supplied to the second differential input terminal (V2) of the phase comparator (11).

In the calibration action for the first modulator, the controller keeps changing a ratio of DC biasing currents to the first transistor (M11) and second transistor (M21) of the first modulator until the phase comparator (11) produces the phase conversion output signal ($V_{PD}$) of the predetermined detection state ($V_M$).

In the calibration action for the first modulator, the controller stops changing the ratio of DC biasing currents in the first modulator at a time when the phase comparator (11) produces the phase conversion output signal ($V_{PD}$) of the predetermined detection state ($V_M$).

In the calibration action for reducing carrier leakage associated with the second modulator (2), the second non-inverted local signal (LoQ) and second inverted local signal (/LoQ) are supplied to the first differential input terminal (V1) of the phase comparator (11).

On the other hand, in the calibration action for the second modulator, carrier signals leaking at the first non-inverted RF transmit output terminal ($MOD_{out}$) and first inverted RF transmit output terminal (/$MOD_{out}$) of the transmission modulator (10) are supplied to the second differential input terminal (V2) of the phase comparator (11).

In the calibration action for the second modulator, the controller keeps changing a ratio of DC biasing currents to the seventh transistor (M12) and eighth transistor (M22) of the second modulator until the phase comparator (11) produces the phase conversion output signal ($V_{PD}$) of the predetermined detection state ($V_M$).

In the calibration action for the second modulator, the controller stops changing the ratio of DC biasing currents in the second modulator at a time when the phase comparator (11) produces the phase conversion output signal ($V_{PD}$) of the predetermined detection state ($V_M$).

The transmitter according to another preferred embodiment further includes a first D/A converter (14) and a second D/A converter (15).

The first D/A converter (14) is used to change the ratio of DC biasing currents to the first transistor (M11) and second transistor (M21) of the first modulator (1).

The second D/A converter (15) is used to change the ratio of DC biasing currents to the seventh transistor (M12) and eighth transistor (M22) of the second modulator (2).

The controller (13) includes a first control register for controlling the first D/A converter (14), and a second control register for controlling the second D/A converter (15).

In an early stage of the calibration action for the first modulator (1), a digital value of the first control register of the controller (13) is set to an initial value such that the DC biasing currents to the first transistor (M11) and second transistor (M21) of the first modulator (1) are substantially equalized to each other. In the calibration action for the first modulator, the controller keeps updating the digital value of the first control register until the phase comparator (11) produces the phase conversion output signal ($V_{PD}$) of the predetermined detection state ($V_M$). The controller stops updating the digital value of the first control register at a time when the phase comparator (11) produces the phase conversion output signal ($V_{PD}$) of the predetermined detection state ($V_M$) (see Steps 72 to 74 of FIG. 7).

In an early stage of the calibration action for the second modulator (2), a digital value of the second control register of the controller (13) is set to an initial value such that the DC biasing currents to the seventh transistor (M12) and eighth transistor (M22) of the second modulator (2) are substantially equalized to each other. In the calibration action of the second modulator, the controller keeps updating the digital value of the second control register until the phase comparator (11) produces the phase conversion output signal ($V_{PD}$) of the predetermined detection state ($V_M$); the controller stops updating the digital value of the second control register at a time when the phase comparator (11) produces the phase conversion output signal ($V_{PD}$) of the predetermined detection state ($V_M$) (see Steps 75 to 77 of FIG. 7).

In the transmitter according to another preferred embodiment, the digital value of the first control register at the time when the controller stops updating the digital value of the first control register in the calibration action for the first modulator is a piece of control digital information which minimizes the carrier leakage associated with the first modulator. The digital value of the second control register at the time when the controller stops updating the digital value of the second control register in the calibration action for the second modulator is a piece of control digital information which minimizes the carrier leakage associated with the second modulator.

In the transmitter according to a more preferred embodiment, the phase comparator (11) is composed of a double-balanced analog phase comparator circuit (Q1-Q6, R1, R2, C1, C2). The phase conversion output signal ($V_{PD}$) arising from a differential output terminal of the double-balanced analog phase comparator circuit is supplied to a differential input terminal of a voltage comparator (12), and a comparative output signal ($V_{CMP}$) from the voltage comparator (12) is supplied to the controller (13) (see FIG. 12).

The transmitter according to another more preferred embodiment further includes a first limiter amplifier (18) and a second limiter amplifier (19).

The pair of first non-inverted local signal (LoI) and first inverted local signal (/LoI), and the pair of second non-inverted local signal (LoQ) and second inverted local signal (/LoQ) are selectively supplied to a pair of differential input terminals of the first limiter amplifier (18). An output signal from a differential output terminal of the first limiter amplifier (18) is transmitted to the first differential input terminal (V1) of the phase comparator (11).

The leaked carrier signals arising at the output terminals of the transmission modulator (10) are supplied to a pair of differential input terminals of the second limiter amplifier (19). An output signal from a differential output terminal of the second limiter amplifier (19) is transmitted to the second differential input terminal (V2) of the phase comparator (11).

The transmitter according to a still more preferred embodiment further includes a first delay regulator (20) and a second delay regulator (21).

The first delay regulator (20) is connected between the pair of differential output terminals of the first limiter amplifier (18), and the first differential input terminal (V1) of the phase comparator (11).

The second delay regulator (21) is connected between the pair of differential output terminals of the second limiter amplifier (19), and the second differential input terminal (V2) of the phase comparator (11) (see FIG. 8).

According to a specific embodiment, the predetermined phase difference is about 90°, and the transmission modulator (10) including the first modulator (1) and the second modulator (2) works as a quadrature modulator (see FIG. 3).

According to the most specific embodiment, the transmission modulator (10) including the first modulator (1) and the second modulator (2) is of a type used for a transmitter based on a direct up-conversion (DUC) architecture. The transmitter based on DUC architecture transmits an RF transmit signal according to at least one system of GSM850, GSM900, DCS1800, PCS1900, and Band1, Band2 and Band5 of WCDMA to a base station (see FIGS. 14 and 15).

2. Further Detailed Description of the Preferred Embodiments

Next, the embodiments will be described further in detail. It is noted that as to all the drawings to which reference is made in describing the preferred embodiments, the parts having identical functions are identified by the same reference numerals, and the repeated description thereof is avoided herein.

<<Transmitter Based on DUC Architecture>>

FIG. 3 is a diagram showing a transmitter of a communication RF IC based on the direct up-conversion (DUC) architecture according to an embodiment of the invention.

Unlike the transmitter shown in FIG. 1, the transmitter according to this embodiment shown in FIG. 3 is additionally provided with a phase comparator 11, a voltage comparator 12, a controller 13, a first D/A converter 14, a second D/A converter 15, a switch 16 and a DC biasing circuit 17, which are for the purpose of reducing the carrier leakage owing to local signals.

Like the transmitter shown in FIG. 1, in the transmitter shown in FIG. 3, the transmission modulator 10 includes a first modulator 1 and a second modulator 2; the phase of a first non-inverted local signal LoI of RF frequency supplied to the first modulator 1, and the phase of a second non-inverted local signal LoQ of RF frequency supplied to the second modulator 2 are set to make a predetermined phase difference. In a specific form of the invention, the predetermined phase difference is approximately 90°, and therefore the transmission modulator 10 including the first modulator 1 and second modulator 2 works as a quadrature modulator. The first RF transmit signal from the first modulator 1, and the second RF transmit signal from the second modulator 2 undergo vector syntheses by the load resistances $R_{L1}$ and $R_{L2}$, whereby RF transmit signals $MOD_{out}$ and $/MOD_{out}$ are produced. The RF transmit signals $MOD_{out}$ and $/MOD_{out}$ resulting from the vector syntheses are amplified by a RF power amplifier (PA), and then launched to a base station through an antenna.

The first non-inverted and inverted local signals LoI and /LoI supplied to the first modulator 1, and the second non-inverted and inverted local signals LoQ and /LoQ supplied to the second modulator 2 can be fed to the first differential input terminal V1 of the phase comparator 11 selectively. The RF transmit signals $MOD_{out}$ and $/MOD_{out}$ resulting from vector syntheses by the load resistances $R_{L1}$ and $R_{L2}$ can be supplied to the second differential input terminal V2 of the phase comparator 11. When the phase difference between input signals to the first and second differential input terminals V1 and V2 of the phase comparator 11 reaches the predetermined phase difference, e.g., 90°, the phase conversion output signal $V_{PD}$, is made a predetermined detection state $V_M$. In case that the phase difference between input signals to the first and second differential input terminals V1 and V2 is below the predetermined phase difference, e.g., 90°, the phase conversion output signal $V_{PD}$ is made a first detection state $V_R$ different from the predetermined detection state $V_M$. In the case that the phase difference between input signals to the first and second differential input terminals V1 and V2 is above the predetermined phase difference, e.g., 90°, the phase conversion output signal $V_{PD}$ is made a second detection state $V_L$ different from predetermined detection state $V_M$.

The phase conversion output signal $V_{PD}$, arising from the differential output terminal of the phase comparator 11 is supplied to the differential input terminal of the voltage comparator 12. The voltage comparator 12 amplifies a change of the phase conversion output signal $V_{PD}$ from the phase comparator 11 with respect to a phase difference between input signals to the first and second differential input terminals V1 and V2, which is equal to or near the predetermined phase difference, e.g., 90°, and produces a comparative output signal $V_{CMP}$.

FIG. 4 shows the change in the phase conversion output signal $V_{PD}$ from the phase comparator 11, and the change in the comparative output signal $V_{CMP}$ from the voltage comparator 12 in response to a phase difference Δφ between input signals to the first and second differential input terminals V1 and V2 of the phase comparator 11 in the transmitter according to the embodiment of the invention as shown in FIG. 3.

The controller 13 contains a control register for storing digital signals supplied to the first and second D/A converters 14 and 15. As the controller 13 updates digital signals in the control register in response to a calibration instruction for reducing the leakage of carriers, analog signals I1 and I2 from the D/A converters 14 and 15 are changed in their analog values. The analog signals I1 and I2 from the D/A converters 14 and 15 are supplied to the DC biasing circuit 17 through changeover switches SW1 and SW2 in the switch 16.

As the DC biasing voltage supplied from the DC biasing circuit 17 to the gate of one of the MOS transistors M11 and M21 of the first modulator 1 can be changed, the ratio of DC biasing currents of the MOS transistors M11 and M21 can be also varied. Likewise, as the DC biasing voltage supplied from the DC biasing circuit 17 to the gate of one of the MOS transistors M12 and M22 of the second modulator 2 can be changed, the ratio of DC biasing currents of the MOS transistors M12 and M22 can be also varied. As to the first modulator 1, the ratio of DC biasing currents of the paired transistors is controlled so that the effect of the carrier signal leakage owing to the imbalance of the base-collector capacitance between the paired transistors in terms of pair comparableness cancels out the effect of the carrier signal leakage owing to the imbalance of the DC biasing current between the paired transistors in terms of the pair comparableness.

The phase comparator 11 can be used to detect a condition that the carrier signal leakage associated with the first non-inverted local signal LoI and first inverted local signal /LoI in the first modulator 1 has been canceled out in response to a calibration instruction. Specifically, in a condition that the carrier signal leakage associated with the first local signals LoI and /LoI has been canceled out, carrier signals for the second local signals LoQ and /LoQ are leaking into the RF transmit signals $MOD_{out}$ and /$MOD_{out}$. On the one hand, the first local signals LoI and /LoI are supplied to the first differential input terminal V1 of the phase comparator 11, on the other hand, carrier signals coming from the second local signals LoQ and /LoQ and leaking into the RF transmit signals $MOD_{out}$ and /$MOD_{out}$ are supplied to the second differential input terminal V2 of the phase comparator 11. As the phase difference between input signals to the first and second differential input terminals V1 and V2 of the phase comparator 11 is made the predetermined phase difference, e.g., 90°, the phase conversion output signal $V_{PD}$ is made the predetermined detection state $V_M$. This is detected as a change of the comparative output signal $V_{CMP}$ from the voltage comparator 12, and digital signals in the condition that the carrier signal leakage is canceled out are held in the control register of the controller 13.

Likewise, the phase comparator 11 can be used to detect a condition that the carrier signal leakage associated with the second non-inverted local signal LoQ and second inverted local signal /LoQ in the second modulator 2 has been canceled out in response to a calibration instruction. Specifically, in a condition that the carrier signal leakage associated with the second local signals LoQ and /LoQ has been canceled out, carrier signals for the first local signals LoI and /LoI are leaking into the RF transmit signals $MOD_{out}$ and /$MOD_{out}$. On the one hand, the second local signals LoQ and /LoQ are supplied to the first differential input terminal V1 of the phase comparator 11, on the other hand, carrier signals coming from the first local signals LoI and /LoI and leaking into the RF transmit signals $MOD_{out}$ and /$MOD_{out}$ are supplied to the second differential input terminal V2 of the phase comparator 11. As the phase difference between input signals to the first and second differential input terminals V1 and V2 of the phase comparator 11 is made the predetermined phase difference, e.g., 90°, the phase conversion output signal $V_{PD}$ is made the predetermined detection state $V_M$. This is detected as a change of the comparative output signal $V_{CMP}$ from the voltage comparator 12, and a digital signal when the carrier signal leakage is canceled out is held in the control register of the controller 13.

<<Phase Comparator and Voltage Comparator>>

Figure 12:
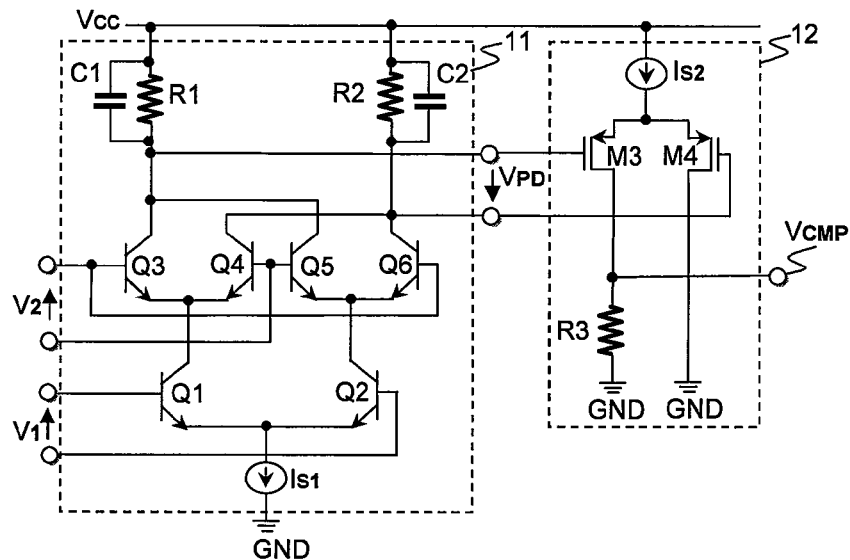
FIG. 12 is a diagram showing a layout of the phase comparator and voltage comparator of the transmitter shown in FIG. 3.

FIG. 12 is a diagram showing a layout of the phase comparator 11 and voltage comparator 12 of the transmitter according to the embodiment of the invention shown in FIG. 3.

As shown in the drawing, the phase comparator 11 is composed of a double-balanced analog phase comparator circuit, which is termed "Gilbert cell". The phase comparator 11 includes: a first transistor pair of NPN bipolar transistors Q1 and Q2; a second transistor pair of NPN bipolar transistors Q3 and Q4; a third transistor pair of NPN bipolar transistors Q5 and Q6; load resistances R1 and R2; smoothing capacitors C1 and C2; and a current source $I_{S1}$. Bases of the NPN bipolar transistors Q1 and Q2 of the first transistor pair of the phase comparator 11 are activated by input signals to the first differential input terminal V1 of the phase comparator 11. Bases of the NPN bipolar transistors Q3 and Q4 of the second transistor pair of the phase comparator 11, and bases of the NPN bipolar transistors Q5 and Q6 of the third transistor pair are activated by input signals to the second differential input terminal V2 of the phase comparator 11. The collector currents of the transistors Q3 and Q5 are passed through the load resistance R1, whereas the collector currents of the transistors Q4 and Q6 are passed through the load resistance R2. The phase conversion output signal $V_{PD}$, which is a voltage drop corresponding to input phase information, arises between the load resistances R1 and R2. The smoothing capacitors C1 and C2 serve to bypass RF carrier components to an AC ground point of the source voltage Vcc.

As shown in FIG. 12, the voltage comparator 12 includes: a current source $I_{S2}$; P-channel MOS transistors M3 and M4; and a resistance R3. Sources of the MOS transistors M3 and M4 are connected to the source voltage Vcc through a current source $I_{S2}$. Gates of the MOS transistors M3 and M4 are activated by the phase conversion output signal $V_{PD}$ of the phase comparator 11. The drain of the MOS transistor M3 is connected to the ground voltage GND through the resistance R3, and the comparative output signal $V_{CMP}$ is developed across the resistance R3.

Figure 13:
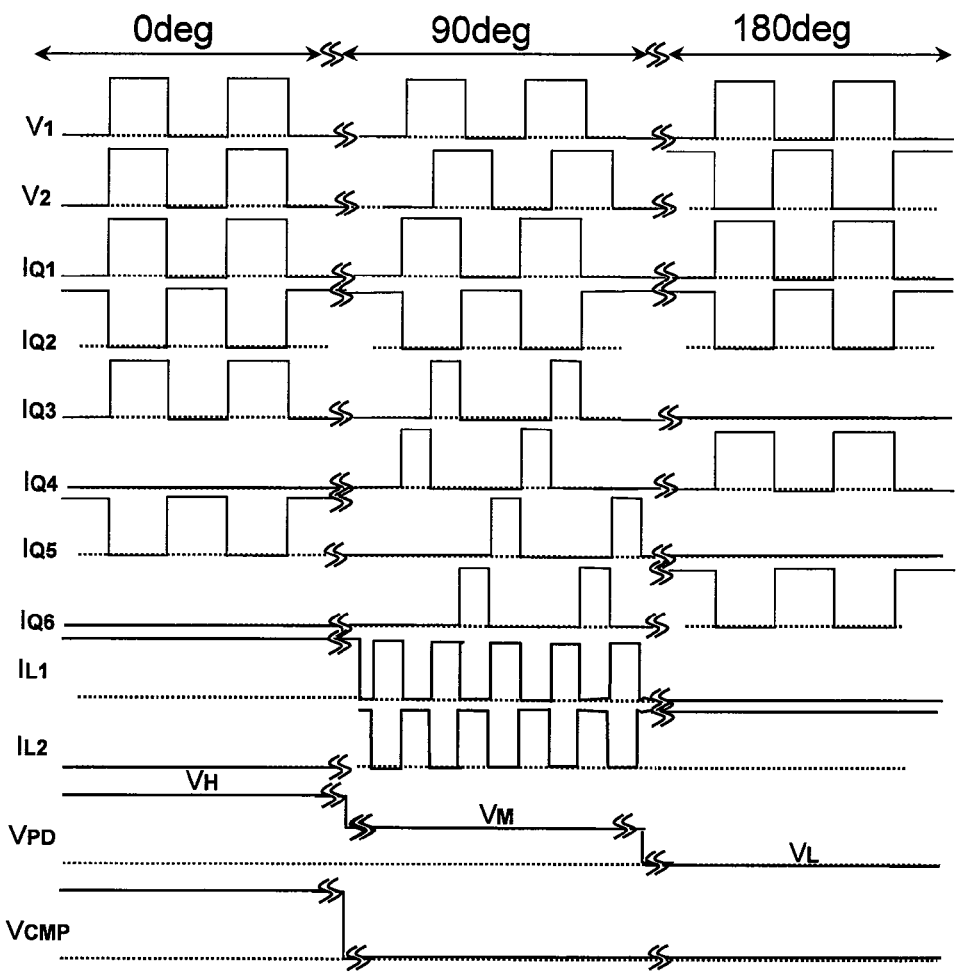
FIG. 13 is a diagram showing waveforms at the parts of the phase comparator and voltage comparator when changing the phase difference between input signals to the first and second differential input terminals of the phase comparator as shown in FIGS. 12 to 0°, 90° and 180°.

FIG. 13 is a diagram showing waveforms at the parts of the phase comparator 11 and voltage comparator 12 when changing the phase difference Δφ between input signals to the first and second differential input terminals V1 and V2 of the phase comparator 11 as shown in FIGS. 12 to 0°, 90° and 180°.

The following are shown in the drawing: the waveforms of an input signals to the first and second differential input terminals V1 and V2 of the phase comparator 11; the waveforms of collector currents $I_{Q1}$-$I_{Q6}$ of the transistors Q1-Q6; the waveforms of currents $I_{L1}$ and $I_{L2}$ passing through the load resistances R1 and R2; the waveform of the phase conversion output signal $V_{PD}$; and the waveform of the comparative output signal $V_{CMP}$.

<<Calibration Action for Reducing Carrier Leakage>>

FIGS. 5A-5D are diagrams of assistance in explaining the way the carrier signal leakage coming from the first local signals LoI and /LoI is canceled out in response to a calibration instruction for reducing the leakage of carriers in the first modulator 1 of the transmission modulator 10 of the transmitter according to the embodiment of the invention shown in FIG. 3.

Figure 5A:
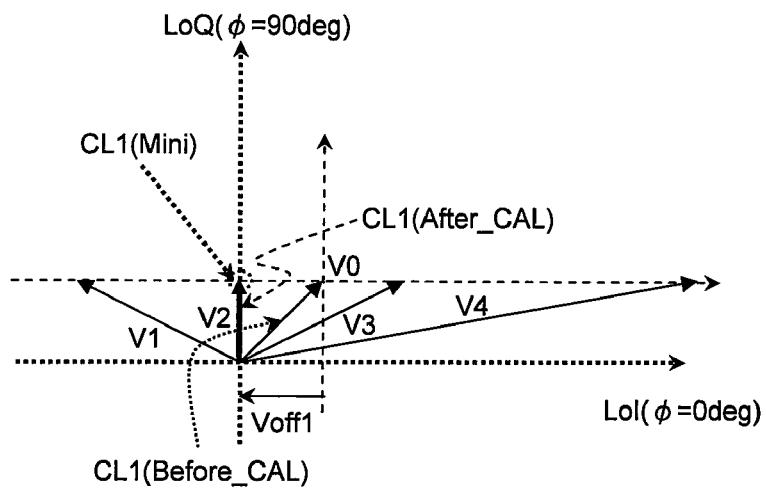
FIGS. 5A-5D are diagrams of assistance in explaining the way the carrier signal leakage coming from first local signals is canceled out in response to a calibration instruction for reducing the leakage of carriers in a first modulator of a transmission modulator of the transmitter shown in FIG. 3.
Figure 5B:
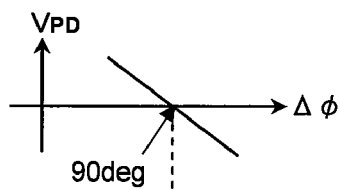
Figure 5C:
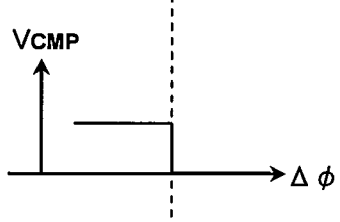
Figure 5D:
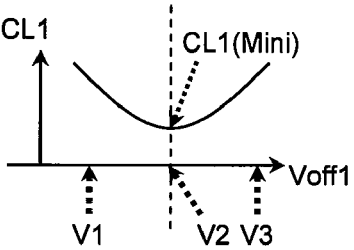

Horizontal and vertical axes of FIGS. 5A-5D show a vector of the first local signal LoI with a phase of 0°, and a vector of the second local signal LoQ with a phase of 90°, respectively. Before execution of the calibration instruction for reducing the leakage of carriers in the first modulator 1, carrier signal leakage CL1 (Before_CAL) indicated by the vector V0 occurs in the first modulator 1 as shown in FIG. 5A. X and Y components of the carrier signal leakage CL1 (Before_CAL) in the first modulator 1 correspond to the carrier signal leakage coming from the first local signals LoI and /LoI in the first modulator 1, and the carrier signal leakage coming from the second local signals LoQ and /LoQ in the second modulator 2, respectively. The carrier signal leakage coming from the first local signals LoI and /LoI in the first modulator 1 is a result of a combination of the effect of the imbalance of the base-collector capacitance between the paired transistors in the first modulator 1 and the effect of the imbalance of the DC biasing current between the paired transistors. Likewise, the carrier signal leakage coming from the second local signals LoQ and /LoQ in the second modulator 2 is a result of a combination of the effect of the imbalance of the base-collector capacitance between the paired transistors in the second modulator 2 and the effect of the imbalance of the DC biasing current between the paired transistors.

In response to execution of the calibration instruction for reducing the leakage of carriers in the first modulator 1, the controller 13 starts updating the digital value of the control register, and therefore a conversion analog signal current I1 from the first D/A converter 14 is supplied to the DC biasing circuit 17 through the changeover switch $SW_1$ of the switch 16. During the execution of the calibration instruction, only DC biasing voltages identical to each other are supplied to the gate of the MOS transistor M11 and the gate of the MOS transistor M21 of the first modulator 1 through the non-inverted baseband signal input terminal $I_{in}$ and inverted baseband signal input terminal $/I_{in}$. Early in the execution of the calibration instruction, the changeover switch $SW_1$ of the switch 16, for example, is connected to the terminal on the right in the drawing, and therefore the conversion analog signal current I1 from the first D/A converter 14 develops a voltage drop on the resistance R in the DC biasing circuit 17 with respect to the gate of the MOS transistor M11. When the conversion analog signal current I1 from the first D/A converter 14 is increased by update of the digital value of the control register by the controller 13, the DC biasing current of the MOS transistor M11 is decreased. Then, the ratio of the DC biasing currents of the MOS transistor M11 and MOS transistor M21 in the first modulator 1 is changed, and the carrier signal leakage coming from the first inverted local signal /LoI with a phase of 180° is raised. As a result, the carrier signal leakage CL1 in the first modulator 1 is changed from the vector V0 toward vectors V2 and V1 by execution of the calibration instruction for reducing the leakage of carriers in the first modulator 1 as shown in FIG. 5A. In the state indicated by the vector V2, the carrier signal leakage coming from the first local signal LoI with the phase of 0°, and the carrier signal leakage coming from the first inverted local signal /LoI with the phase of 180° are canceled out completely, and only the carrier signal leakage coming from the second local signal LoQ with the phase of 90° in the second modulator 2 remains. The presence of the carrier signal leakage coming from the second local signal LoQ with the phase of 90° at the RF transmit signal terminals $MOD_{out}$ and $/MOD_{out}$ can be detected by the phase comparator 11.

In other words, the first local signals LoI and /LoI are supplied to the first differential input terminal V1 of the phase comparator 11, whereas carrier signals coming from the second local signals LoQ and /LoQ leaking into the RF transmit signals $MOD_{out}$ and $/MOD_{out}$ are supplied to the second differential input terminal V2 of the phase comparator 11. As the phase difference between input signals to the first and second differential input terminals V1 and V2 of the phase comparator 11 is made the predetermined phase difference, e.g., 90°, the phase conversion output signal $V_{PD}$ is made the predetermined detection state $V_M$. This is detected as a change of the comparative output signal $V_{CMP}$ from the voltage comparator 12, and the controller 13 holds, in the control register, a digital signal when the carrier signal leakage is canceled out.

Meanwhile, the vector V0 of the carrier signal leakage in the first modulator 1 before the execution of the calibration instruction for reducing the leakage of carriers in the first modulator 1 can be attributed to the carrier signal leakage coming from the first inverted local signal /LoI with the phase of 180°. In this case, the changeover switch $SW_1$ of the switch 16 is connected to the terminal on the right in the drawing, and the carrier signal leakage cannot be canceled out even if the calibration instruction is conducted. In this case, after the detection of a phase difference of input signals to the first and second differential input terminals V1 and V2 of the phase comparator 11, which exceeds the predetermined phase difference, e.g., 90°, the changeover switch $SW_1$ of the switch 16 is switched from the right-side terminal to the left-side one according to the result of the detection. Then, when the conversion analog signal current I1 from the first D/A converter 14 is increased by update of the digital value of the control register by the controller 13, the DC biasing current of the MOS transistor M21 is decreased. Hence, the ratio of the DC biasing current of the MOS transistors M11 and M21 in the first modulator 1 is changed, and the carrier signal leakage coming from the first non-inverted local signal LoI with the phase of 0° is increased. As a result, the carrier signal leakage CL1 in the first modulator 1 is changed toward the right like the vectors V3 and V4 by execution of the calibration instruction for reducing the leakage of carriers in the first modulator 1 as shown in FIG. 5A. In this way, the carrier signal leakage coming from the first inverted local signal /LoI with the phase of 180°, and the carrier signal leakage coming from the first non-inverted local signal LoI with the phase of 0° can be canceled out completely.

FIGS. 6A-6D are diagrams of assistance in explaining the way the carrier signal leakage coming from the second local signals LoQ and /LoQ is canceled out in response to the calibration instruction for reducing the leakage of carriers in the second modulator 2 of the transmission modulator 10 of the transmitter according to the embodiment of the invention shown in FIG. 3.

Figure 6A:
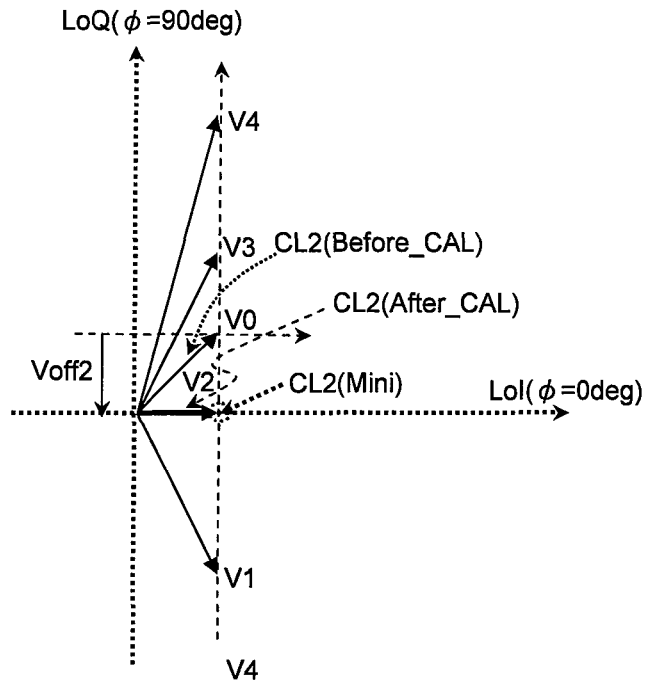
FIGS. 6A-6D are diagrams of assistance in explaining the way the carrier signal leakage coming from second local signals is canceled out in response to the calibration instruction for reducing the leakage of carriers in a second modulator of the transmission modulator of the transmitter shown in FIG. 3.
Figure 6B:
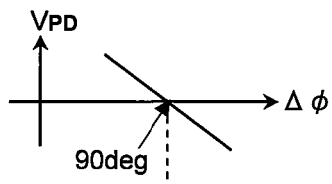
Figure 6C:
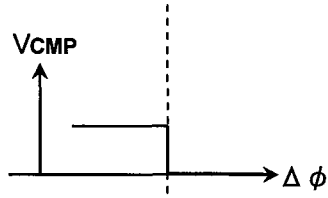
Figure 6D:
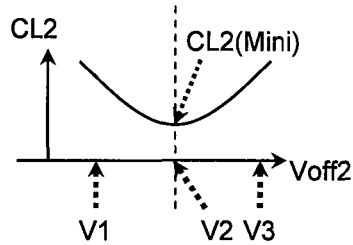

Horizontal and vertical axes of FIGS. 6A-6D show a vector of the first local signal LoI with a phase of 0°, and a vector of the second local signal LoQ with a phase of 90°, respectively. Before execution of the calibration instruction for reducing the leakage of carriers in the second modulator 2, carrier signal leakage CL2 (Before_CAL) indicated by the vector V0 occurs in the second modulator 2 as shown in FIG. 6A. X and Y components of the carrier signal leakage CL2 (Before_CAL) in the second modulator 2 correspond to the carrier signal leakage coming from the first local signals LoI and /LoI in the first modulator 1, and the carrier signal leakage coming from the second local signals LoQ and /LoQ in the second modulator 2, respectively. The carrier signal leakage coming from the first local signals LoI and /LoI in the first modulator 1 is a result of a combination of the effect of the imbalance of the base-collector capacitance between the paired transistors in the first modulator 1 and the effect of the imbalance of the DC biasing current between the paired transistors. Likewise, the carrier signal leakage coming from the second local signals LoQ and /LoQ in the second modulator 2 is a result of a combination of the effect of the imbalance of the base-collector capacitance between the paired transistors in the second modulator 2 and the effect of the imbalance of the DC biasing current between the paired transistors.

In response to execution of the calibration instruction for reducing the leakage of carriers in the second modulator, the controller 13 starts updating the digital value of the control register, and therefore a conversion analog signal current I2 from the second D/A converter 15 is supplied to the DC biasing circuit 17 through the changeover switch SW$_2$ of the switch 16. During the execution of the calibration instruction, only DC biasing voltages identical to each other are supplied to the gate of the MOS transistor M12 and the gate of the MOS transistor M22 of the second modulator 2 through the non-inverted baseband signal input terminal Q$_{in}$ and inverted baseband signal input terminal /Q$_{in}$. Early in the execution of the calibration instruction, the changeover switch SW$_2$ of the switch 16, for example, is connected to the terminal on the left in the drawing, and therefore the conversion analog signal current I2 from the second D/A converter 15 develops a voltage drop on the resistance R in the DC biasing circuit 17 with respect to the gate of the MOS transistor M12. When the conversion analog signal current I2 from the second D/A converter 15 is increased by update of the digital value of the control register by the controller 13, the DC biasing current of the MOS transistor M12 is decreased. Then, the ratio of the DC biasing currents of the MOS transistor M12 and MOS transistor M22 in the second modulator 2 is changed, and the carrier signal leakage coming from the second inverted local signal /LoQ with a phase of 270° is raised. As a result, the carrier signal leakage CL2 in the second modulator 2 is changed from the vector V0 toward vectors V2 and V1 by execution of the calibration instruction for reducing the leakage of carriers in the second modulator 2 as shown in FIG. 6A. In the state indicated by the vector V2, the carrier signal leakage coming from the second local signal LoQ with the phase of 90°, and the carrier signal leakage coming from the second inverted local signal /LoQ with the phase of 270° are canceled out completely, and only the carrier signal leakage coming from the first local signal LoI with the phase of 0° in the first modulator 1 remains. The presence of the carrier signal leakage coming from the first local signal LoI with the phase of 0° at the RF transmit signal terminals MOD$_{out}$ and /MOD$_{out}$ can be detected by the phase comparator 11.

In other words, the second local signals LoQ and /LoQ are supplied to the first differential input terminal V1 of the phase comparator 11, whereas carrier signals coming from the first local signals LoI and /LoI leaking into the RF transmit signals MOD$_{out}$ and /MOD$_{out}$ are supplied to the second differential input terminal V2 of the phase comparator 11. As the phase difference between input signals to the first and second differential input terminals V1 and V2 of the phase comparator 11 is made the predetermined phase difference, e.g., 90°, the phase conversion output signal V$_{PD}$ is made the predetermined detection state V$_M$. This is detected as a change of the comparative output signal V$_{CMP}$ from the voltage comparator 12, and the controller 13 holds, in the control register, a digital signal when the carrier signal leakage is canceled out.

Meanwhile, the vector V0 of the carrier signal leakage in the second modulator 2 before the execution of the calibration instruction for reducing the leakage of carriers in the second modulator 2 can be attributed to the carrier signal leakage coming from the second inverted local signal /LoQ with the phase of 270°. In this case, the changeover switch SW$_2$ of the switch 16 is connected to the terminal on the left in the drawing, and the carrier signal leakage cannot be canceled out even if the calibration instruction is conducted. In this case, after the detection of a phase difference of input signals to the first and second differential input terminals V1 and V2 of the phase comparator 11, which exceeds the predetermined phase difference, e.g., 90°, the changeover switch SW$_2$ of the switch 16 is switched from the left-side terminal to the right-side one according to the result of the detection. Then, when the conversion analog signal current I2 from the second D/A converter 15 is increased by update of the digital value of the control register by the controller 13, the DC biasing current of the MOS transistor M22 is decreased. Hence, the ratio of the DC biasing current of the MOS transistors M12 and M22 in the second modulator 2 is changed, and the carrier signal leakage coming from the second non-inverted local signal LoQ with the phase of 90° is increased. As a result, the carrier signal leakage CL2 in the second modulator 2 is changed upward like the vectors V3 and V4 by execution of the calibration instruction for reducing the leakage of carriers in the second modulator 2 as shown in FIG. 6A. In this way, the carrier signal leakage coming from the second inverted local signal /LoQ with the phase of 270°, and the carrier signal leakage coming from the second non-inverted local signal LoQ with the phase of 90° can be canceled out completely.

<<Flow of Calibration Action>>

Figure 7:
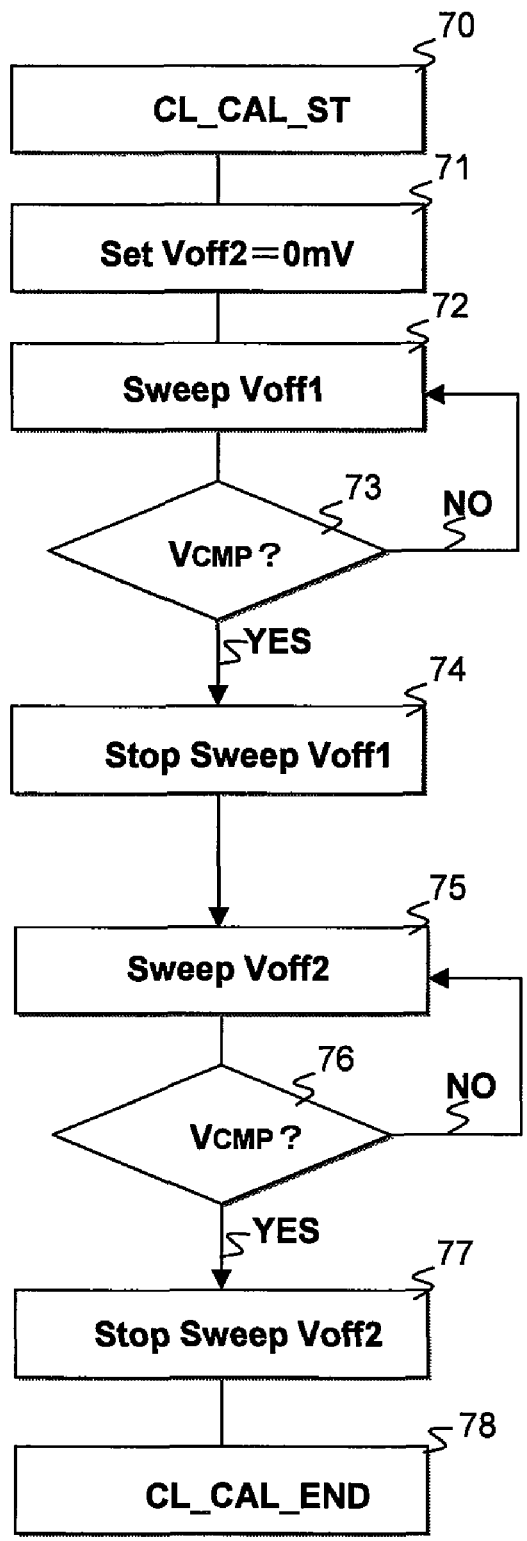
FIG. 7 is a flowchart showing an action flow to perform calibration for reducing the leakage of carriers in the first and second modulators of the transmission modulator of the transmitter shown in FIG. 3.

FIG. 7 is a flowchart showing an action flow to perform calibration for reducing the leakage of carriers in the first and second modulators 1 and 2 of the transmission modulator 10 of the transmitter according to an embodiment of the invention shown in FIG. 3.

In Step 70 of FIG. 7, the controller 13 starts a calibration action in response to the calibration instruction. In the subsequent Step 71, before calibration of the first modulator 1, the offset voltage Voff2 between the non-inverted baseband signal input terminal Q$_{in}$ connected to the gate of the MOS transistor M12 of the second modulator 2 and the inverted baseband signal input terminal /Q$_{in}$ connected to the gate of the MOS transistor M22 is set to zero millivolt.

Further in the subsequent Step 72, the calibration of the first modulator 1 of the transmission modulator 10 incorporating the phase comparator 11, voltage comparator 12, controller 13, first D/A converter 14, switch 16 and DC biasing circuit 17 is started. Early in the calibration action, the offset voltage Voff1 between the non-inverted baseband signal input terminal I$_{in}$ connected to the gate of the MOS transistor M11 of the first modulator 1, and the inverted baseband signal input terminal connected to the gate of the MOS transistor M21 is set to zero millivolt, and the digital value of the control register of the controller 13, which controls the first D/A converter 14, is also set to zero. Further the changeover switch SW$_1$ of the switch 16 is connected to either the right- or left-side terminal. Gradually increasing the digital value of the control register of the controller 13 from zero raises the conversion analog signal current I1 of the first D/A converter 14, and thus the offset voltage Voff1 is also gradually increased from zero millivolt.

The increase (sweep) of the offset voltage Voff1 in Step 72 is continued until the level of the comparative output signal $V_{CMP}$ from the voltage comparator 12 is inverted in Step 73. The event of the inversion of the level corresponds to the event that the phase difference between input signals to the first and second differential input terminals V1 and V2 of the phase comparator 11 is made 90°, and the phase conversion output signal $V_{PD}$ is made the predetermined detection state $V_M$. In response to the inversion of the level of the comparative output signal $V_{CMP}$ from the voltage comparator 12 in Step 73, the controller 13 stops updating the digital value of the control register. The content of the control register of the controller 13 at this point makes control digital information to cancel out the carrier signal leakage coming from the first local signals LoI and /LoI with RF frequency and the phase of 0° in the first modulator 1.

Then, in Step 74, the increase (sweep) of the offset voltage Voff1 is stopped with the content of the control register of the controller 13 held therein before calibration of the second modulator 2.

Further in the subsequent Step 75, the calibration of the second modulator 2 of the transmission modulator 10 incorporating the phase comparator 11, voltage comparator 12, controller 13, second D/A converter 15, switch 16 and DC biasing circuit 17 is started. Early in the calibration action, the offset voltage Voff2 between the non-inverted baseband signal input terminal $Q_{in}$ connected to the gate of the MOS transistor M12 of the second modulator 2, and the inverted baseband signal input terminal /$Q_{in}$ connected to the gate of the MOS transistor M22 is set to zero millivolt, and the digital value of the control register of the controller 13, which controls the second D/A converter 15, is also set to zero. Further the changeover switch $SW_2$ of the switch 16 is connected to either the right- or left-side terminal. Gradually increasing the digital value of the control register of the controller 13 from zero raises the conversion analog signal current I2 of the second D/A converter 15, and thus the offset voltage Voff2 is also gradually increased from zero millivolt.

The increase of the offset voltage Voff2 in Step 75 is continued until the level of the comparative output signal $V_{CMP}$ from the voltage comparator 12 is inverted in Step 76. The event of the inversion of the level corresponds to the event that the phase difference between input signals to the first and second differential input terminals V1 and V2 of the phase comparator 11 is made 90°, and the phase conversion output signal $V_{PD}$ is made the predetermined detection state $V_M$. In response to the inversion of the level of the comparative output signal $V_{CMP}$ from the voltage comparator 12 in Step 76, the controller 13 stops updating the digital value of the control register. The content of the control register of the controller 13 at this point makes control digital information to cancel out the carrier signal leakage coming from the second local signals LoQ and /LoQ with RF frequency and the phase of 90° in the second modulator 2.

In the subsequent Step 77, the increase (sweep) of the offset voltage Voff2 is stopped with the content of the control register of the controller 13 held therein. Then, a series of the calibration action are terminated in Step 78.

After the termination of the series of calibration action have been thus completed in Step 78, the controller 13 makes an initial setting for a transmit action prior to the direct up-conversion from a baseband signal to an RF transmit signal by the first and second modulators 1 and 2 of the transmission modulator 10 of the transmitter shown in FIG. 3. In the initial setting for a transmit action, the controller 13 transfers digital values in its two control registers to the first and second D/A converters 14 and 15 in parallel. Thus, in the first modulator 1, the ratio of the DC biasing currents of the MOS transistors M11 and M21 is set so as to cancel out the carrier signal leakage coming from the first local signals LoI and /LoI with RF frequency and the phase of 0°. At the same time, also in the second modulator 2, the ratio of the DC biasing currents of the MOS transistors M12 and M22 is set so as to cancel out the carrier signal leakage coming from the second local signals LoQ and /LoQ with RF frequency and the phase of 90°.

<<Improved Transmitter on DUC Architecture>>

FIG. 8 is a diagram showing an improved transmitter of a communication RF IC based on the direct up-conversion (DUC) architecture according to a second embodiment of the invention. Unlike the transmitter shown in FIG. 3, the transmitter according to this embodiment shown in FIG. 8 is additionally provided with a first limiter amplifier 18, a second limiter amplifier 19, a first delay regulator 20 and a second delay regulator 21. Also, the transmitter shown in FIG. 8 is additionally provided with a transmit voltage control oscillator (TxVCO) 22 operable to produce a local signal of RF frequency for transmission, and a phase divider 23 operable to form a predetermined phase difference (90°) between the first local signal LoI supplied to the first modulator 1 and the second local signal LoQ supplied to the second modulator 2. Further, the transmit voltage control oscillator (TxVCO) 22 is incorporated in a PLL frequency synthesizer, whereby the RF frequency of the local signal produced by the transmit voltage control oscillator (TxVCO) 22 can be controlled to be a stable and accurate value.

In the transmission modulator 10 of the transmitter shown in FIG. 8, an output terminal of the first modulator 1 and an output terminal of the second modulator 2 are connected with first and second input terminals of an adder 4, respectively; the adder 4 is for vector synthesis of a first RF transmit signal from the first modulator 1 and a second RF transmit signal from the second modulator 2. Hence, an RF transmit signal $MOD_{out}$ produced by the vector synthesis is output from an output terminal of the adder 4. Further, the transmission modulator 10 of the transmitter shown in FIG. 8 is additionally provided with a select-switch circuit 3 for selecting the first local signal LoI supplied to the first modulator 1 and the second local signal LoQ supplied to the second modulator 2; the selected local signal is supplied to the first differential input terminal V1 of the phase comparator 11. That is, one of the first local signal LoI supplied to the first modulator 1 and the second local signal LoQ supplied to the second modulator 2, which are supplied to the first and second input terminals of the select-switch circuit 3 respectively, is selected, and the selected local signal is output through the output terminal of the select-switch circuit 3.

The first limiter amplifier 18 connected with the output terminal of the select-switch circuit 3 serves to reduce the influence of noises contained in the selected local signal, which is output through the output terminal of the select-switch circuit 3, on the phase conversion output signal $V_{PD}$ of the phase comparator 11. Further, the second limiter amplifier 19 connected with the output terminal of the adder 4 serves to reduce the influence of noises contained in the carrier signal leakage coming from the first or second local signal LoI or LoQ leaking into the RF transmit signal $MOD_{out}$ from the output terminal of the adder 4 on the phase conversion output signal $V_{PD}$ of the phase comparator 11.

The first delay regulator 20 connected with the output terminal of the first limiter amplifier 18 adjusts the timing of signals supplied to the first differential input terminal V1 of the phase comparator 11 in response to the supply of the first local signal LoI and the second local signal LoQ to the first and second input terminals of the select-switch circuit 3, provided that the first local signal LoI is supplied to the first modulator 1, and the second local signal LoQ is supplied to the second modulator 2. The second delay regulator 21 connected with the output terminal of the second limiter amplifier 19 adjusts the timing of signals supplied to the second differential input terminal V2 of the phase comparator 11 in response to the first or second local signal LoI or LoQ leaked into the RF transmit signal $MOD_{out}$ from the output terminal of the adder 4.

The collectors of the transistors Q11, Q41, Q42, Q12, Q21, Q31, Q32, and Q22, which are connected commonly and used as the output terminals $MOD_{out}$ and $/MOD_{out}$ of the adder 4, have relatively large parasitic capacitances, and therefore the timing of signals supplied from the output terminal of the adder 4 to the second differential input terminal V2 of the phase comparator 11 involves a relatively large delay.

The parasitic capacitances of the bases of the transistor Q11, Q41, Q42, Q12, Q21, Q31, Q32 and Q22 used as terminals to input the first and second local signals LoI and LoQ to the first and second modulators 1 and 2 are relatively smaller in comparison to the parasitic capacitances of the collectors. Therefore, the timing of signals supplied to the first differential input terminal V1 of the phase comparator 11 from the output terminal of the phase divider 23 involves a relatively small delay.

The first and second delay regulators 20 and 21 are additionally provided in the transmitter shown in FIG. 8, and the delay time Td1 of the first delay regulator 20 and the delay time Td2 of the second delay regulator 21 are set so as to substantially equalize the timing of signals supplied to the first differential input terminal V1 of the phase comparator 11, and the timing of signals supplied to the second differential input terminal V2 of the phase comparator 11. Thus, the addition of the first and second delay regulators 20 and 21 to the transmitter shown in FIG. 8 enables the improvement of the control accuracy of calibration for canceling out the carrier signal leakage coming from the first and second local signals LoI and LoQ.

<<Execution Timing of the Calibration Action>>

Figure 9:
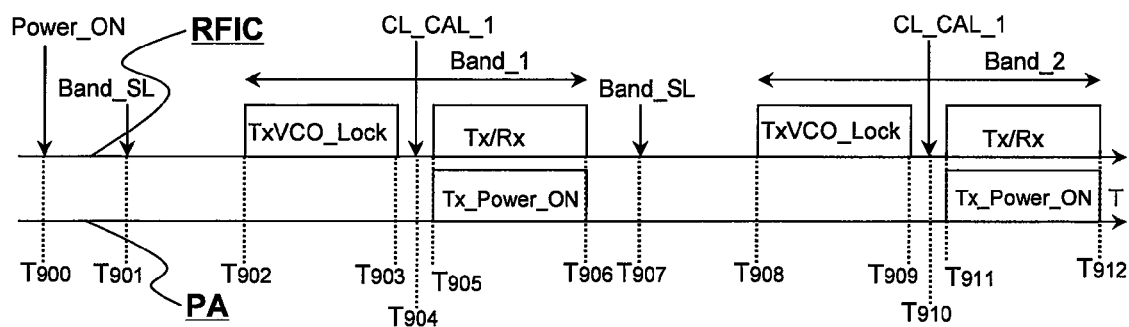
FIG. 9 is a diagram of assistance in explaining the execution timing of a calibration action in the transmitter of the communication RF IC based on the direct up-conversion architecture shown in FIG. 8.

FIG. 9 is a diagram of assistance in explaining the execution timing of the calibration action in the transmitter of the communication RF IC based on the direct up-conversion (DUC) architecture according to the second embodiment of the invention shown in FIG. 8.

In the transmitter of the communication RF IC based on the DUC architecture shown in FIG. 8, the first local signal LoI supplied to the first modulator 1 and the second local signal LoQ supplied to the second modulator 2 are produced by the transmit voltage control oscillator (TxVCO) 22 for transmission.

The transmit voltage control oscillator 22 is incorporated in the PLL frequency synthesizer, and oscillates to emit signals in multiple bands. In the oscillation and emission in multiple bands, oscillation frequencies at which the transmit voltage control oscillator 22 can oscillates with one oscillation control tuning voltage exist in multiple bands. On one hand, the oscillation control tuning voltage is applied to a variable-capacitance device of the transmit voltage control oscillator 22, on the other hand, the value of a band select capacitance is discretely selected by a band select signal. To stabilize the RF frequency of a local signal produced by the transmit voltage control oscillator (TxVCO) 22 incorporated in the PLL frequency synthesizer after such band selection, a considerable length of PLL lock time is required.

As in FIG. 9, at the time $T_{900}$ the communication RF IC shown in FIG. 8 is supplied with the source voltage Vcc. Thereafter, at the time $T_{901}$ the band of the transmit voltage control oscillator (TxVCO) 22 is selected according to the band select signal. After the selection of the band at the time $T_{901}$, the PLL lock action of the PLL frequency synthesizer with the transmit voltage control oscillator (TxVCO) 22 incorporated therein is started at the time $T_{902}$. At the time $T_{202}$, the PLL lock action is terminated, and the RF frequency of local signals produced by the transmit voltage control oscillator 22 is stabilized. At the time $T_{904}$ after the termination of the PLL lock action, the calibration action (CA_CAL_1) for reducing the leakage of carriers, which had been described with reference to FIG. 7, is executed out and then terminated in the first and second modulators 1 and 2 of the transmission modulator 10 of the transmitter shown in FIG. 8. During the period between the time $T_{905}$ and time $T_{906}$ after the termination of the calibration action for reducing the leakage of carriers executed at the time $T_{904}$, the transmitter of the communication RF IC shown in FIG. 8 based on the DUC architecture executes a transmit action (Tx) in parallel with a receive action (Rx) according to CDMA system. Also, during the period between the time $T_{9Q5}$ and time $T_{906}$, the RF power amplifier (PA) for transmitting an RF transmit signal to a base station through the antenna is supplied with the source voltage (Tx_Power_ON).

After that, if the band selection is made according to a band select signal so that the transmit voltage control oscillator (TxVCO) 22 is shifted to another band at the time $T_{907}$, the same actions as those between the time $T_{902}$ and time $T_{906}$ are performed between the time $T_{908}$ and time $T_{912}$.

<<Improved Calibration Action>>

It become clear from the examination by the inventors that the flow of the calibration action for reducing the leakage of carriers according to the embodiment of the invention shown in FIG. 7 still had a problem as follows.

The problem is caused by using the presence of the carrier leakage coming from the second local signals LoQ and /LoQ with RF frequency and the phase of 90° in the second modulator 2, in regard to the action of reducing the carrier leakage coming from the first local signals LoI and /LoI with RF frequency and the phase of 0° in the first modulator 1 of Step 71 to Step 74. The carrier signal leakage CL1 in the first modulator 1 is changed from the vector V0 toward the vectors V2 and V1 by the execution of the calibration instruction for reducing the leakage of carriers in the first modulator 1, as shown in FIG. 5A. In the state indicated by the vector V2, the carrier signal leakage coming from the first local signal LoI with the phase 0°, and the carrier signal leakage coming from the first inverted local signal /LoI with the phase of 180° are canceled out completely, and only the carrier signal leakage coming from the second local signal LoQ with the phase of 90° in the second modulator 2 remains.

The change from the vector V0 toward vectors V2 and V1 is caused by the offset voltage Voff1 owing to the voltage drop by the resistance R of the DC biasing circuit 17 involved with the conversion analog signal current I1 of the first D/A converter 14 of the transmitter shown in FIG. 3. However, first D/A converter 14 is finite in resolution, and the minimum step Voff1_LSB of the offset voltage Voff1 caused by the voltage drop by the resistance R of the DC biasing circuit 17 involved with the conversion analog signal current I1 of the first D/A converter 14 determines the accuracy of control. On the other hand, if there is an excessively large abundance of the carrier signal leakage of the second local signal LoQ with the phase 90° in the second modulator 2 at the time of canceling out the carrier signal leakage of the first local signal LoI with the phase of 0°, and the carrier signal leakage of the first inverted local signal /LoI with the phase of 180°, the amount of vector's directional change (phase), which can be controlled by the minimum step Voff1_LSB, will be reduced.

Figure 10:
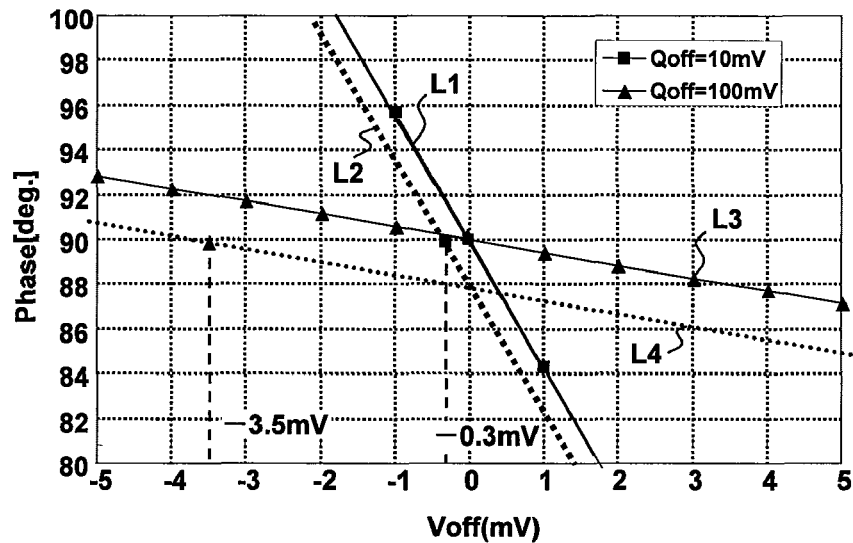
FIG. 10 is a diagram showing the way the relation between an offset voltage depending on a conversion analog signal current of a D/A converter, and an amount of a vector's directional change (phase) is changed according to the abundance of carrier signal leakage in connection with the calibration action flow shown in FIG. 7.

FIG. 10 is a diagram showing the way the relation between the offset voltage Voff depending on the conversion analog signal current of the first D/A converter, and the amount of vector's directional change (phase) is changed according to figures of the abundance of carrier signal leakage in the calibration action flow according to an embodiment of the invention shown in FIG. 7.

In FIG. 10, the characteristic curve L1 shows a relation between the offset voltage and the amount of the directional change (phase) when the abundance Qoff of the carrier signal leakage coming from the second local signal LoQ with the phase of 90° in the second modulator 2 under the situation of Step 71 of the calibration action flow described with reference to FIG. 7 is a relatively small value, 10 mV in terms of the offset voltage Voff2. Turing to the characteristic curve L1, it can be seen that the amount of vector's directional change (phase) can be controlled largely by changing the offset voltage Voff1 depending on the conversion analog signal current I1 of the first D/A converter 14, for the purpose of reducing the carrier leakage in the first modulator 1.

As to the transmitter shown in FIG. 8, it is assumed that the error of the timing of signals supplied to the first differential input terminal V1 of the phase comparator 11, and the error of the timing of signals supplied to the second differential input terminal V2 of the phase comparator 11 change the phase difference from an ideal phase difference 90° to 88°, whereby the characteristic curve showing the relation between the offset voltage and the amount of the vector's directional change is changed from the curve L1 to L2. In this case, lowering the offset voltage Voff1 depending on the conversion analog signal current I1 of the first D/A converter 14 by 0.3 mV, it can be detected by the phase comparator 11 that the phase difference between input signals to the first and second differential input terminals V1 and V2 is made the predetermined phase difference of 90°. As a result, it can be detected by the phase comparator 11 that the carrier signal leakage coming from the first local signal LoI with the phase of 0° and the carrier signal leakage coming from the first inverted local signal /LoI with the phase of 180° are canceled out in the first modulator 1 completely.

In FIG. 10, the characteristic curve L3 shows a relation between the offset voltage and the amount of the directional change (phase) when the abundance Qoff of the carrier signal leakage coming from the second local signal LoQ with the phase of 90° in the second modulator 2 under the situation of Step 71 of the calibration action flow described with reference to FIG. 7 is a relatively large value, 100 mV in terms of the offset voltage Voff2. Turing to the characteristic curve L3, it can be seen that the amount of vector's directional change (phase) can be only slightly controlled by changing the offset voltage Voff1 depending on the conversion analog signal current I1 of the first D/A converter 14, for the purpose of reducing the carrier leakage in the first modulator 1.

As to the transmitter shown in FIG. 8, it is assumed that the error of the timing of signals supplied to the first differential input terminal V1 of the phase comparator 11, and the error of the timing of signals supplied to the second differential input terminal V2 of the phase comparator 11 change the phase difference from an ideal phase difference 90° to 88°, whereby the characteristic curve showing the relation between the offset voltage and the amount of the vector's directional change is changed from the curve L3 to L4. In this case, widely lowering the offset voltage Voff1 depending on the conversion analog signal current I1 of the first D/A converter 14 by 3.5 mV, it can be barely detected by the phase comparator 11 that the phase difference between input signals to the first and second differential input terminals V1 and V2 is made the predetermined phase difference of 90°. Thus, it can be barely detected by the phase comparator 11 that the carrier signal leakage coming from the first local signal LoI with the phase of 0° and the carrier signal leakage coming from the first inverted local signal /LoI with the phase of 180° are canceled out in the first modulator 1 completely.

However, the abundance Qoff of the carrier signal leakage coming from the second local signal LoQ with the phase of 90° in the second modulator 2 under the situation of Step 71 of the calibration action flow described with reference to FIG. 7 can be increased further. In such case, it is impossible to control the phase difference between input signals to the first and second differential input terminals V1 and V2 to be the predetermined phase difference of 90° within a control range in which the offset voltage Voff1 can be controlled by the conversion analog signal current I1 of the first D/A converter 14. Therefore, it becomes difficult to perform calibration for reducing the leakage of carriers in the calibration action flow described with reference to FIG. 7, in the first and second modulators 1 and 2 of the transmission modulator 10 of the transmitter according to the embodiment of the invention shown in FIG. 3 or 8.

To cope with such situation, the calibration action needs to be improved.

Figure 11:
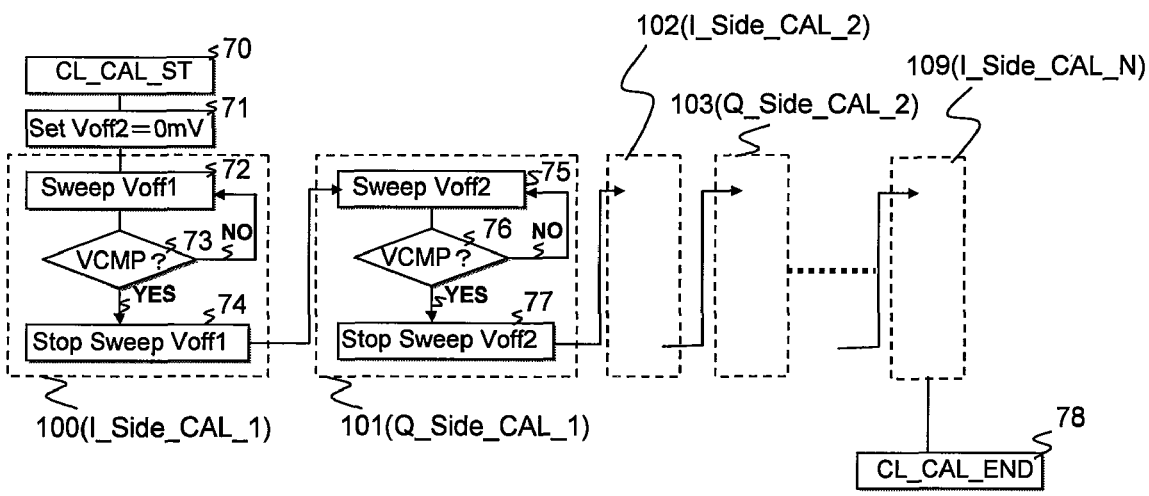
FIG. 11 is a flowchart showing an action flow to perform an improved calibration for reducing the leakage of carriers in the first and second modulators of the transmission modulator of the transmitter shown in FIG. 3 or 8.

FIG. 11 is a flowchart showing an action flow to perform an improved calibration for reducing the leakage of carriers in the first and second modulators 1 and 2 of the transmission modulator 10 of the transmitter according to the embodiment of the invention shown in FIG. 3 or 8.

In Step 70 shown in FIG. 11, the calibration action is started as in Step 70 of FIG. 7. In the subsequent Step 71 of FIG. 11, before calibration of the first modulator 1, the offset voltage Voff2 between the non-inverted baseband signal input terminal $Q_n$ connected to the gate of the MOS transistor M12 of the second modulator 2 and the inverted baseband signal input terminal /$Q_{in}$ connected to the gate of the MOS transistor M22 is set to zero millivolt as in Step 71 of FIG. 7.

In Step 100 of FIG. 11, the first calibration action I_Side_CAL_1 for reducing the carrier signal leakage coming from the first local signals LoI and /LoI in first modulator 1 is performed as in Steps 72 to 74 of FIG. 7.

Thereafter in Step 101 of FIG. 11, the first calibration action Q_Side_CAL_1 for reducing the carrier signal leakage coming from the second local signals LoQ and /LoQ in the second modulator 2 is conducted as in Steps 75 to 77 of FIG. 7.

After that, in Step 102 of FIG. 11 the second calibration action I_Side_CAL_2 for reducing the carrier signal leakage coming from the first local signals LoI and /LoI in the first modulator 1 is performed as in Steps 72 to 74 of FIG. 7.

Further, in Step 103 of FIG. 11 the second calibration action Q_Side_CAL_2 for reducing the carrier signal leakage coming from the second local signals LoQ and /LoQ in the second modulator 2 is carried out as in Steps 75 to 77 of FIG. 7. After that, the same steps are repeated.

Finally, in Step 109 of FIG. 11 the $N^{th}$ calibration action Q_Side_CAL_N for reducing the carrier signal leakage coming from the second local signals LoQ and /LoQ in the second modulator 2 is performed as in Steps 75 to 77 of FIG. 7.

Thus, the abundance of the carrier signal leakage in each modulator can be reduced progressively by repeating the calibration action for reducing the carrier signal leakage in the first modulator 1, and the calibration action for reducing the carrier signal leakage in the second modulator 2. It has been found from an actual circuit design of the communication RF IC that the deviation from the ideal phase difference 90° for the timings of input signals supplied to the first and second differential input terminals V1 and V2 of the phase comparator 11 can be allowed up to 33° by setting the number of executions of the calibration action to six.

<<Configuration of a Mobile Phone>>

Figure 14:
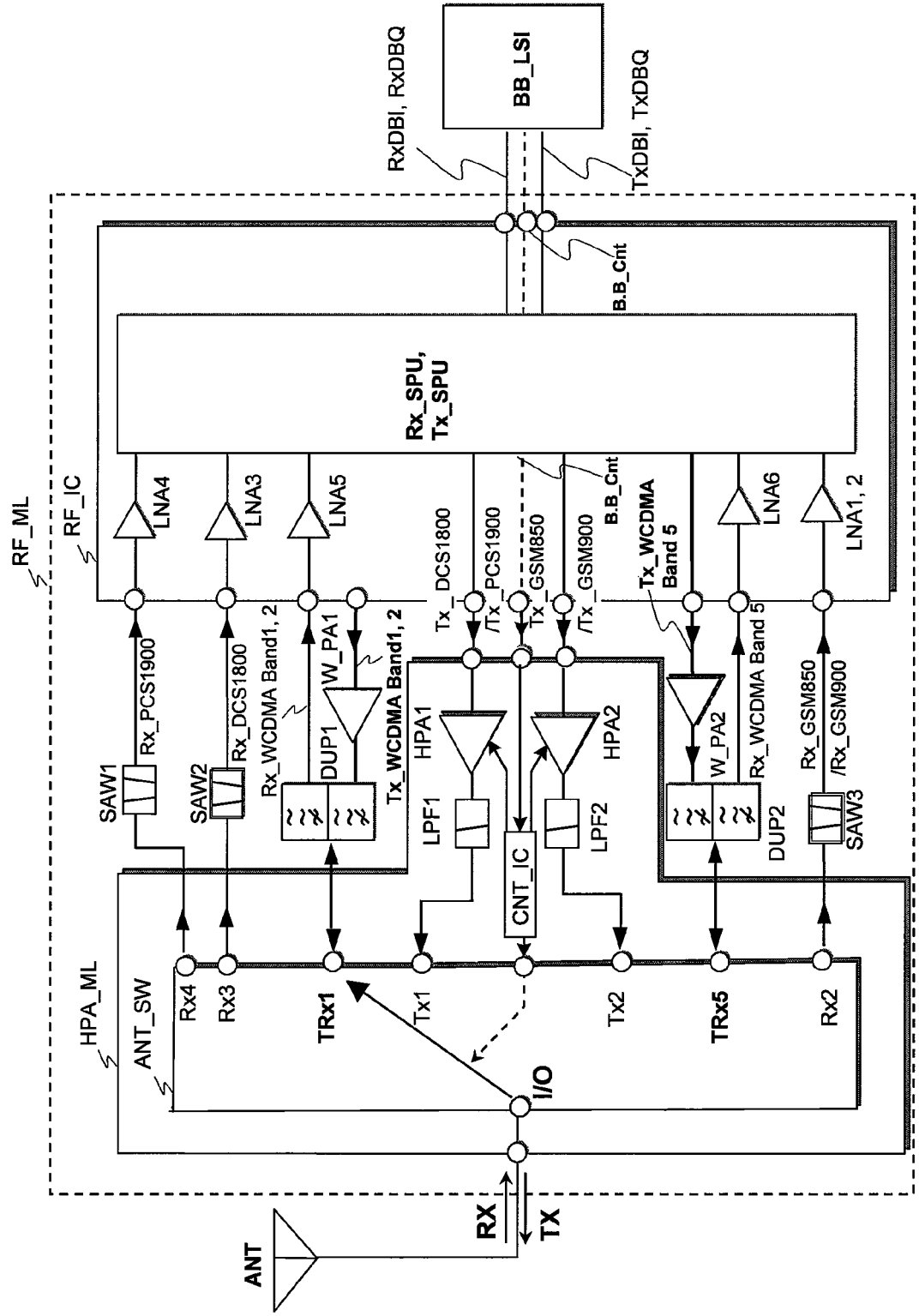
FIG. 14 is a block diagram showing a configuration of a mobile phone, which has an RF module incorporating a communication RF IC according to one of the embodiments of the invention, an antenna switch MMIC and an RF power amplifier, and a baseband signal processing LSI.

FIG. 14 is a block diagram showing a configuration of a mobile phone, which has an RF module incorporating a communication RF IC according to one of the embodiments of the invention described above, an antenna switch MMIC and an RF power amplifier; and a baseband signal processing LSI. Now, it is noted that MMIC stands for "Microwave Monolithic IC".

The communication RF IC included in the mobile phone shown in FIG. 14 enables transmission and reception of signals with Band1, Band2 and Band 5 of WCDMA system as well as transmission and reception of signals according to GSM850, GSM900, DCS1800 and PCS1900 systems.

Figure 15:
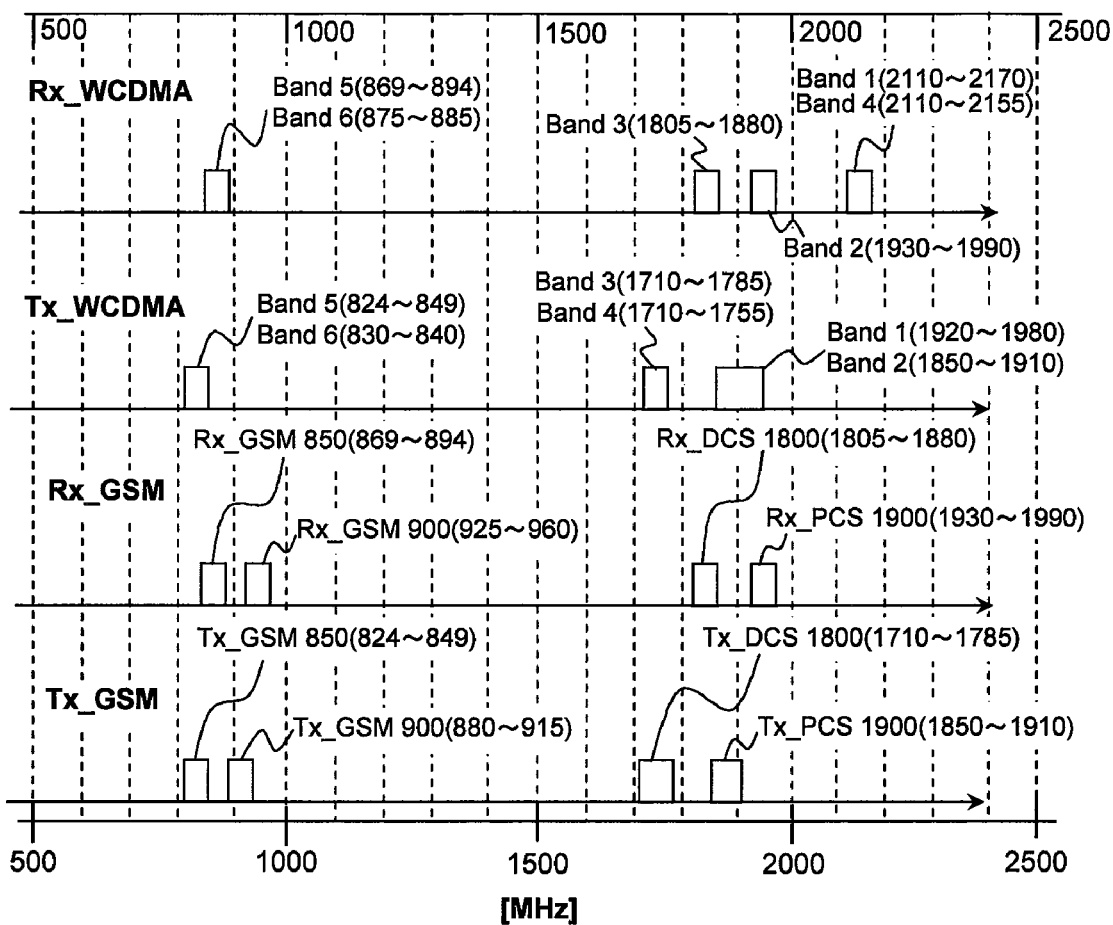
FIG. 15 is a diagram showing communication bands for transmission and reception according to various communication systems for mobile phones.

FIG. 15 is a diagram showing communication bands for transmission and reception according to various communication systems for mobile phones. In upper portions of FIG. 15, communication bands for transmission and reception of WCDMA system are shown. In the case of Band5, the lowest WCDMA frequency band, whose service area is USA, the frequency band of RF transmit signals TX for wireless communication terminals ranges from 824 to 849 MHz, whereas the frequency band of RF receive signals RX for wireless communication terminals is between 869 and 894 MHz. Further, in the case of Band2 of WCDMA system, whose service area is EU, the frequency band of RF transmit signals TX for wireless communication terminals ranges from 1850 to 1910 MHz, whereas the frequency band of RF receive signals RX for wireless communication terminals is between 1930 and 1990 MHz. In addition, in the case of Band1, the highest WCDMA frequency band compliant with UMTS standards, whose service area is USA, the frequency band of RF transmit signals TX for wireless communication terminals ranges from 1920 to 1980 MHz, whereas the frequency band of RF receive signals RX for wireless communication terminals is between 2110 and 2170 MHz.

Further, there are still other WCDMA communications. In the case of Band6, a lower WCDMA frequency band, whose service area is Japan, the frequency band of RF transmit signals TX for wireless communication terminals ranges from 830 to 840 MHz, whereas the frequency band of RF receive signals RX for wireless communication terminals is between 875 and 885 MHz. In the case of Band4, another WCDMA frequency band, whose service area is USA, the frequency band of RF transmit signals TX for wireless communication terminals ranges 1710 to 1775 MHz, whereas the frequency band of RF receive signals RX for wireless communication terminals is between 2110 and 2155 MHz. Further, in the case of Band 3, another WCDMA frequency band, whose service area is EU, the frequency band of RF transmit signals TX for wireless communication terminals ranges 1710 to 1785 MHz, whereas the frequency band of RF receive signals RX for wireless communication terminals is between 1805 and 1880 MHz.

In lower portions of FIG. 15, communication bands for transmission and reception of communication systems other than WCDMA communication system are shown. In the case of GSM850, the frequency band of RF transmit signals TX for wireless communication terminals ranges 824 to 849 MHz, whereas the frequency band of RF receive signals RX for wireless communication terminals is between 869 and 894 MHz. In the case of GSM900, the frequency band of RF transmit signals TX for wireless communication terminals ranges 880 to 915 MHz, whereas the frequency band of RF receive signals RX for wireless communication terminals is between 925 and 960 MHz. In the case of DCS1800, the frequency band of RF transmit signals TX for wireless communication terminals ranges 1710 to 1785 MHz, whereas the frequency band of RF receive signals RX for wireless communication terminals is between 1805 and 1880 MHz. In the case of PCS1900, the frequency band of RF transmit signals TX for wireless communication terminals ranges 1850 to 1910 MHz, whereas the frequency band of RF receive signals RX for wireless communication terminals is between 1930 and 1990 MHz. As described above, FDD system in which the receive band frequency RX is higher than the transmit band frequency TX is adopted for any of the frequency bands. Incidentally, FDD stands for "Frequency Division Duplex".

As shown in FIG. 14, a common input/output terminal I/O of the antenna switch MMIC (ANT_SW) of the RF module RF_ML is connected to the antenna ANT for transmission and reception of the mobile phone. A control signal B.B_Cnt from the baseband signal processing LSI (BB_LSI) is passed through the RF analog signal processing semiconductor integrated circuit RF IC, and then supplied to the controller integrated circuit (CNT_IC) of the large-output power-amplifier module (HPA_ML). A flow of RF signals into the common input/output terminal I/O from the antenna ANT for transmission and reception is a result of a receive action RX of the mobile phone, and a flow of RF signals toward the antenna ANT for transmission and reception from the common input/output terminal I/O is attributed to a transmit action TX of the mobile phone.

The communication RF IC performs the frequency up-conversion of transmit digital baseband signals TxDBI and TxDBQ from the baseband signal processing LSI (BB_LSI) into RF transmit signals. Also, the communication RF IC performs the frequency down-conversion of RF receive signals received with the antenna ANT for transmission and reception into receive digital baseband signals RxDBI and RxDBQ, and supplies the resultant signals to the baseband signal processing LSI (B_LSI).

The antenna switch MMIC (ANT_SW) of the RF module RF_ML establishes a signal path between the common input/output terminal I/O and one of transmit terminals Tx1 and Tx2, receive terminals Rx2, Rx3 and Rx4, and transmit/receive terminals TRx1 and TRx5, and performs the receive action RX and transmit action TX selectively. The switch for the receive and transmit actions on RF signals is composed of HEMT (High Electron Mobility Transistor). The antenna switch MMIC is composed of MIC (Microwave Monolithic Integrated Circuit), which is formed from a compound semiconductor such as GaAs. The isolation required for the antenna switch MMIC (ANT_SW) can be achieved by setting the impedance of a signal path other than the signal path established for the receive action RX or transmit action TX to an extremely high value. In the field of antenna switches, the common input/output terminal I/O is termed "Single Pole", and a total of the seven terminals, i.e. the transmit terminals Tx1 and Tx2, receive terminals Rx2, Rx3 and Rx4 and transmit/receive terminals TRx1 and TRx5, are termed "7 throw". Therefore, the antenna switch MMIC (ANT_SW) shown in FIG. 14 is a switch of SP1T (Single Pole 7 throw) type.

Although this is not shown in the drawing, the baseband signal processing LSI (B_LSI) is connected to an external nonvolatile memory and an application processor. The application processor is connected to a liquid crystal display device (not shown) and a key input device (not shown), and therefore various application programs including general-purpose programs and electronic games can be run with the application processor. Various application programs including a boot program (or start initializing program) for mobile devices such as mobile phones, an operating system program (OS), and programs for phase demodulation of receive baseband signals and phase modulation of transmit baseband signals of e.g., GSM system by a digital signal processor (DSP) inside the baseband signal processing LSI can be stored in the external nonvolatile memory.

<<Transmit and Receive Actions According to GSM850 and GSM900>>

Now, it is assumed that transmit baseband signals TxDBI and TxDBQ from the baseband signal processing LSI (BB_LSI) must be subjected to frequency up-conversion to a band of GSM850. In this case, the transmit signal processing unit Tx_SPU of the communication RF IC performs frequency up-conversion of the transmit baseband signals to a band of GSM850, whereby RF transmit signals Tx_GSM850 of GSM850 are produced. Next, it is assumed that the transmit baseband signals from the baseband signal processing LSI (BB_LSI) must be subjected to frequency up-conversion to a band of GSM900. In this case, the transmit signal processing unit Tx_SPU of the communication RF IC performs frequency up-conversion of the transmit baseband signals to a band of GSM900, whereby RF transmit signals Tx_GSM900 of GSM900 are produced. RF transmit signals Tx_GSM850 of GSM850 and RF transmit signals Tx_GSM900 of GSM900 are amplified in electric power by a large-output power amplifier HPA2 of the large-output power-amplifier module (HPA_ML). An RF output from the large-output power amplifier HPA2 is passed through a low-pass filter LPF2, and then supplied to the transmit terminal Tx2 of the antenna switch MMIC (ANT_SW). RF transmit signals Tx_GSM850 of GSM850 and RF transmit signals Tx_GSM900 of GSM900 supplied to the transmit terminal Tx2 can be launched from the antenna ANT for transmission and reception through the common input/output terminal I/O.

A transmitter based on the direct up-conversion (DUC) architecture can be used for frequency up-conversion of transmit baseband signals to a GSM850 band or a GSM900 band. In this case, the embodiments of the invention described with reference to FIGS. 3 to 13 can be used for calibrations for reducing the carrier leakage coming from local signals in first and second modulators of a transmission modulator included in the transmitter based on DUC architecture.

RF receive signals Rx_GSM850 of GSM850 and RF receive signals Rx_GSM900 of GSM900 received with the antenna ANT for transmission and reception are supplied to the common input/output terminal I/O of the antenna switch MMIC (ANT_SW). RF receive signals Rx_GSM850 of GSM850 and RF receive signals Rx_GSM900 of GSM900 acquired from the receive terminal Rx2 of the antenna switch MMIC (ANT_SW) are passed through a surface-acoustic-wave filter SAW3, and then amplified by low-noise amplifiers LNA1 and LNA2 of the communication RF IC. After that, these RF receive signals are supplied to the receive signal processing unit Rx_SPU. The receive signal processing unit Rx_SPU performs frequency down-conversion of RF receive signals Rx_GSM850 of GSM850 or RF receive signals Rx_GSM900 of GSM900 into receive baseband signals RxDBI and RxDBQ.

In a transmit/receive mode of GSM850, the antenna switch MMIC performs transmission of RF transmit signals Tx_GSM850 using the connection between the input/output terminal I/O and transmit terminal Tx2, and reception of RF receive signals Tx_GSM850 using the connection between the input/output terminal I/O and receive terminal Rx2 according to the time division method in response to the control signal B.B_Cnt. In the same way, also in a transmit/receive mode of GSM900, the antenna switch MMIC performs transmission of RF transmit signals Tx_GSM900 using the connection between the input/output terminal I/O and transmit terminal Tx2 and reception of RF receive signals Rx_GSM900 using the connection between the input/output terminal I/O and receive terminal Rx2 according to the time division method, in response to the control signal B.B_Cnt.

<<Transmit and Receive Actions According to DCS1800 and PCS1900>>

Now, it is assumed that transmit baseband signals TxDBI and TxDBQ from the baseband signal processing LSI (BB_LSI) must be subjected to frequency up-conversion to a band of DCS1800. In this case, the transmit signal processing unit Tx_SPU of the communication RF IC performs frequency up-conversion of the transmit baseband signals to a band of DCS1800, whereby RF transmit signals Tx_DCS1800 of DCS1800 are produced. Next, it is assumed that the transmit baseband signals from the baseband signal processing LSI (BB_LSI) must be subjected to frequency up-conversion to a band of PCS1900. In this case, the transmit signal processing unit Tx_SPU of the communication RF IC performs frequency up-conversion of the transmit baseband signals to a band of PCS1900, whereby RF transmit signals Tx_PCS1900 of PCS1900 are produced. The RF transmit signals Tx_DCS1800 of DCS1800 and RF transmit signals Tx_PCS1900 of PCS1900 are amplified in electric power by a large-output power amplifier HPA1 of the large-output power-amplifier module (HPA_ML). An RF output from the large-output power amplifier HPA1 is passed through a low-pass filter LPF1, and then supplied to the transmit terminal Tx1 of the antenna switch MMIC (ANT_SW). RF transmit signals Tx_DCS1800 of DCS1800 and RF transmit signals Tx_PCS1900 of PCS1900 supplied to the transmit terminal Tx1 can be launched from the antenna ANT for transmission and reception through the common input/output terminal I/O.

RF receive signals Rx_DCS1800 of DCS1800 and RF receive signals Rx_PCS1900 of PCS1900 received with the antenna ANT for transmission and reception are supplied to the common input/output terminal I/O of the antenna switch MMIC. RF receive signals Rx_DCS1800 of DCS1800 acquired from the receive terminal Rx3 of the antenna switch MMIC are passed through a surface-acoustic-wave filter SAW2, and then amplified by a low-noise amplifier LNA3 of the communication RF IC. RF receive signals Rx_PCS1900 of PCS1900 acquired from the receive terminal Rx4 of the antenna switch MMIC (ANT_SW) are passed through a surface-acoustic-wave filter SAW1, and then amplified by a low-noise amplifier LNA4 of the communication RF IC. After that, the RF receive signals Rx_DCS1800 of DCS1800 and RF receive signals Rx_PCS1900 of PCS1900 are supplied to the receive signal processing unit Rx_SPU. The receive signal processing unit Rx_SPU performs frequency down-conversion of RF receive signals Rx_DCS1800 of DCS1800 or RF receive signals Rx_PCS1900 of PCS1900 into receive baseband signals RxDBI and RxDBQ.

In a transmit/receive mode of DCS1800, the antenna switch MMIC performs transmission of RF transmit signals Tx_DCS1800 using the connection between the input/output terminal I/O and transmit terminal Tx1, and reception of RF receive signals Rx_DCS1800 using the connection between the input/output terminal I/O and receive terminal Rx3 according to the time division method in response to the control signal B.B_Cnt. In the same way, also in a transmit/ receive mode of PCS1900, the antenna switch MMIC performs transmission of RF transmit signals Tx_PCS1900 using the connection between the input/output terminal I/O and transmit terminal Tx1, and reception of RF receive signals Rx_PCS1900 using the connection between the input/output terminal I/O and receive terminal Rx4 according to the time division method, in response to the control signal B.B_Cnt.

<<Transmit and Receive Actions According to WCDMA>>

It is assumed that transmit digital baseband signals TxDBI and TxDBQ from the baseband signal processing LSI (B_LSI) must be subjected to frequency up-conversion to Band1 or Band2 of WCDMA system. In this case, the transmit signal processing unit Tx_SPU of the communication RF IC performs frequency up-conversion of transmit baseband signals to Band1 or Band2 of WCDMA system. RF transmit signals Tx_WCDMA Band1 or Tx_WCDMA Band2 of Band1 or Band2 of WCDMA system are amplified in electric power by the large-output power amplifier W_PA1, passed through the duplexer DUP1, and then supplied to the transmit/receive terminal TRx1 of the antenna switch MMIC. The RF transmit signals Tx_WCDMA Band1 or Tx_WCDMA Band2 of Band1 or Band2 of WCDMA system supplied to the transmit/receive terminal TRx1 can be launched from the antenna ANT for transmission and reception through the common input/output terminal I/O.

A transmitter based on the direct up-conversion (DUC) architecture can be used for frequency up-conversion of transmit baseband signals to Band1 or Band2 of WCDMA system. In this case, the embodiments of the invention described with reference to FIGS. 3 to 13 can be used for calibrations for reducing the carrier leakage coming from local signals in first and second modulators of a transmission modulator included in the transmitter based on DUC architecture.

In WCDMA system, code division allows transmit and receive actions to be processed in parallel. Specifically, RF receive signals Rx_WCDMA Band1 or Rx_WCDMA Band2 of Band1 or Band2 of WCDMA system, which are received with the antenna ANT for transmission and reception, are supplied to the common input/output terminal I/O of the antenna switch MMIC. RF receive signals Rx_WCDMA Band1 or Rx_WCDMA Band2 of Band1 or Band2 of WCDMA system acquired from the transmit/receive terminal TRx1 of the antenna switch MMIC are passed through a duplexer DUP1, amplified by a low-noise amplifier LNA5 of the communication RF IC, and then supplied to the receive signal processing unit Rx_SPU. The receive signal processing unit Rx_SPU performs frequency down-conversion of RF receive signals Rx_WCDMA Band1 or Rx_WCDMA Band2 of Band1 or Band2 of WCDMA system into receive digital baseband signals RxDBI and RxDBQ. In the parallel processing mode for transmission and reception using Band1 and Band2 of WCDMA system, the antenna switch MMIC performs, in parallel, transmission of RF transmit signals and reception of RF receive signals using the steady connection between the input/output terminal I/O and transmit/receive terminal TRx1 in response to the control signal B.B_Cnt.

Now, it is assumed that transmit digital baseband signals TxDBI and TxDBQ from the baseband signal processing LSI (B_LSI) must be subjected to frequency up-conversion to Band5 of WCDMA system. In this case, the transmit signal processing unit Tx_SPU of the communication RF IC performs frequency up-conversion of the transmit digital baseband signals TxDBI and TxDBQ to Band5 of WCDMA system. RF transmit signals Tx_WCDMA Band5 of Band5 of WCDMA system are amplified in electric power, by a large-output power amplifier W_PA2, passed through the duplexer DUP2, and then supplied to the transmit/receive terminal TRx5 of the antenna switch MMIC. The RF transmit signals Tx_WCDMA Band5 of Band5 of WCDMA system supplied to the transmit/receive terminal TRx5 can be launched from the antenna ANT for transmission and reception through the common input/output terminal I/O.

A transmitter based on the direct up-conversion (DUC) architecture can be used for frequency up-conversion of transmit baseband signals to Band5 of WCDMA system. In this case, the embodiments of the invention described with reference to FIGS. 3 to 13 can be also used for calibrations for reducing the carrier leakage coming from local signals in first and second modulators of a transmission modulator included in the transmitter based on DUC architecture in the same way as described above.

RF receive signals Rx_WCDMA Band5 of Band5 of WCDMA system received with the antenna ANT for transmission and reception are supplied to the common input/output terminal I/O of the antenna switch MMIC. RF receive signals Rx_WCDMA Band5 of Band5 of WCDMA system acquired from the transmit/receive terminal TRx5 of the antenna switch MMIC are passed through a duplexer DUP2, and amplified by a low-noise amplifier LNA6 of the communication RF IC. The amplified signals from the low-noise amplifier LNA6 are supplied to the receive signal processing unit Rx_SPU. The receive signal processing unit Rx_SPU performs frequency down-conversion of RF receive signals Rx_WCDMA Band5 of Band5 of WCDMA system into receive digital baseband signals RxDBI and RxDBQ.

In the parallel processing mode for transmission and reception with Band5 of WCDMA system, the antenna switch MMIC performs, in parallel, transmission of RF transmit signals and reception of RF receive signals using the steady connection between the input/output terminal I/O and transmit/receive terminal TRx5 in response to the control signal B.B_Cnt.

While the invention made by the inventor has been specifically described above based on the embodiments, it is not so limited. It is needless to say that various changes and modifications may be made without departing from the subject matter thereof.

For instance, as to the mobile phone shown in FIG. 14, the communication RF IC and baseband signal processing LSI are formed in different semiconductor chips respectively. However, according to another embodiment, the communication RF IC and baseband signal processing LSI can be integrated into one semiconductor chip as an integrated one-chip.

The MOS transistors M11, M21, M12 and M22 of the first and second modulators 1 and 2 can be replaced with NPN bipolar transistors. In contrast, the transistors Q11 Q21, Q31, Q41, Q21, Q22, Q32 and Q42 of the first modulators 1 and 2 can be replaced with N-channel MOS transistors.

The invention can be applied to not only mobile phones but also transmitters based on the direct up-conversion (DUC) architecture, which are used for RF communication by wireless LAN, etc.

What is claimed is:

1. A transmitter comprising:
a transmission modulator including a first modulator and a second modulator;
a phase comparator; and
a controller,
wherein at a time of transmission by the transmitter, the first modulator is supplied with a pair of first non-inverted and inverted baseband signals, and a pair of first non-inverted and inverted local signals, whereas the second modulator is supplied with a pair of second non-inverted and inverted baseband signals, and a pair of second non-inverted and inverted local signals, at the time of transmission, a first RF transmit signal from the first modulator, and a second RF transmit signal from the second modulator undergo vector syntheses, whereby an RF transmit signal is produced and output through an output terminal of the transmission modulator, the first and second non-inverted local signals are set to have a predetermined phase difference, a phase conversion output signal produced by the phase comparator is brought to a predetermined detection state in case that a phase difference between input signals to first and second differential input terminals of the phase comparator reaches the predetermined phase difference, the controller executes a calibration action for reducing carrier leakage associated with the first modulator and a calibration action for reducing carrier leakage associated with the second modulator in response to a calibration instruction, in the calibration action for the first modulator, the phase comparator is supplied with the pair of first non-inverted and inverted local signals and leaked carrier signals arising at output terminals of the transmission modulator, the first modulator includes a first pair of transistors, which are supplied with the first non-inverted and inverted baseband signals respectively at the time of transmission, in the calibration action for the first modulator, the controller keeps changing a ratio of DC biasing currents to the first pair of transistors of the first modulator until the phase comparator produces the phase conversion output signal of the predetermined detection state, and the controller stops changing the ratio of DC biasing currents to the first pair of transistors of the first modulator at a time when the phase comparator produces the phase conversion output signal of the predetermined detection state, in the calibration action for the second modulator, the phase comparator is supplied with the pair of second non-inverted and inverted local signals and leaked carrier signals arising at the output terminals of the transmission modulator, the second modulator includes a second pair of transistors, which are supplied with the second non-inverted and inverted baseband signals at the time of transmission, and in the calibration action for the second modulator, the controller keeps changing a ratio of DC biasing currents to the second pair of transistors of the second modulator until the phase comparator produces the phase conversion output signal of the predetermined detection state, and the controller stops changing the ratio of DC biasing currents to the second pair of transistors of the second modulator at a time when the phase comparator produces the phase conversion output signal of the predetermined detection state.

2. The transmitter according to claim 1, further comprising:
a first digital-to-analog converter; and
a second digital-to-analog converter,
wherein the first digital-to-analog converter is used to change the ratio of DC biasing currents to the first pair of transistors of the first modulator, and the second digital-to-analog converter is used to change the ratio of DC biasing currents to the second pair of transistors of the second modulator, the controller includes a first control register for controlling the first digital-to-analog converter, and a second control register for controlling the second digital-to-analog converter, in an early stage of the calibration action for the first modulator, a digital value of the first control register of the controller is set to an initial value such that the DC biasing currents to the first pair of transistors of the first modulator are substantially equalized to each other, in the calibration action for the first modulator, the controller keeps updating the digital value of the first control register until the phase comparator produces the phase conversion output signal of the predetermined detection state, and the controller stops updating the digital value of the first control register at a point when the phase comparator produces the phase conversion output signal of the predetermined detection state, in an early stage of the calibration action for the second modulator, a digital value of the second control register of the controller is set to an initial value such that the DC biasing currents to the second pair of transistors of the second modulator are substantially equalized to each other, and in the calibration action for the second modulator, the controller keeps updating the digital value of the second control register until the phase comparator produces the phase conversion output signal of the predetermined detection state, and the controller stops updating the digital value of the second control register at a point when the phase comparator produces the phase conversion output signal of the predetermined detection state.

3. The transmitter according to claim 2, wherein the digital value of the first control register at the time when the controller stops updating the digital value of the first control register in the calibration action for the first modulator is a piece of control digital information which minimizes the carrier leakage associated with the first modulator, and
the digital value of the second control register at the time when the controller stops updating the digital value of the second control register in the calibration action for the second modulator is a piece of control digital information which minimizes the carrier leakage associated with the second modulator.

4. The transmitter according to claim 3, wherein the phase comparator is composed of a double-balanced analog phase comparator circuit,
the phase conversion output signal arising from a differential output terminal of the double-balanced analog phase comparator circuit is supplied to a differential input terminal of a voltage comparator, and
a comparative output signal from the voltage comparator is supplied to the controller.

5. The transmitter according to claim 3, further comprising:
a first limiter amplifier; and
a second limiter amplifier,
wherein the first non-inverted and inverted local signals, and the second non-inverted and inverted local signals are selectively supplied to a pair of differential input terminals of the first limiter amplifier,
an output signal from a differential output terminal of the first limiter amplifier is transmitted to the first differential input terminal of the phase comparator, the leaked carrier signals arising at the output terminals of the transmission modulator are supplied to a pair of differential input terminals of the second limiter amplifier, and an output signal from a differential output terminal of the second limiter amplifier is transmitted to the second differential input terminal of the phase comparator.

6. The transmitter according to claim 5, further comprising:

a first delay regulator; and a second delay regulator, wherein the first delay regulator is connected between the pair of differential output terminals of the first limiter amplifier, and the first differential input terminal of the phase comparator, and the second delay regulator is connected between the pair of differential output terminals of the second limiter amplifier, and the second differential input terminal of the phase comparator.

7. The transmitter according to claim 3, wherein the predetermined phase difference is substantially 90°, and the transmission modulator including the first and second modulators works as a quadrature modulator.

8. The transmitter according to claim 3, wherein the transmission modulator including the first and second modulators is of a type used for a transmitter based on a direct up-conversion (DUC) architecture, and the transmitter on the DUC architecture transmits an RF transmit signal according to at least one system of GSM850, GSM900, DCS1800, PCS1900, and Band1, Band2 and Band5 of WCDMA to a base station.

9. A transmitter, comprising:

a transmission modulator including a first modulator and a second modulator;

a phase comparator; and a controller, wherein the first modulator includes a first transistor, a second transistor, a third transistor, a fourth transistor, a fifth transistor, and a sixth transistor, In the first modulator, a first non-inverted baseband signal is supplied to an input terminal of the first transistor, and a first inverted baseband signal is supplied to an input terminal of the second transistor, at a time of transmission, In the first modulator, an output terminal of the first transistor is commonly connected with a common terminal of the third transistor and a common terminal of the fourth transistor, and an output terminal of the second transistor is commonly connected with a common terminal of the fifth transistor and a common terminal of the sixth transistor, in the first modulator, a first non-inverted local signal is commonly supplied to an input terminal of the third transistor and an input terminal of the sixth transistor, whereas a first inverted local signal is commonly supplied to an input terminal of the fourth transistor and an input terminal of the fifth transistor, the second modulator includes a seventh transistor, an eighth transistor, a ninth transistor, a tenth transistor, an eleventh transistor and a twelfth transistor, in the second modulator, a second non-inverted baseband signal is supplied to an input terminal of the seventh transistor, and a second inverted baseband signal is supplied to an input terminal of the eighth transistor, at the time of transmission, in the second modulator, an output terminal of the seventh transistor is commonly connected with a common terminal of the ninth transistor and a common terminal of the tenth transistor, and an output terminal of the eighth transistor is commonly connected with a common terminal of the eleventh transistor and a common terminal of the twelfth transistor, in the second modulator, a second non-inverted local signal is commonly supplied to an input terminal of the ninth transistor and an input terminal of the twelfth transistor, whereas a second inverted local signal is commonly supplied to an input terminal of the tenth transistor and an input terminal of the eleventh transistor, in the transmission modulator, a first non-inverted RF transmit signal arises from output terminals of the third and fifth transistors of the first modulator, and output terminals of the ninth and eleventh transistors of the second modulator, in the transmission modulator, a first inverted RF transmit signal arises from output terminals of the fourth and sixth transistors of the first modulator, and output terminals of the tenth and twelfth transistors of the second modulator, the first and second non-inverted local signals are set to have a predetermined phase difference, the first non-inverted and inverted local signals supplied to the first modulator, and the second non-inverted and inverted local signals supplied to the second modulator can be supplied to a first differential input terminal of the phase comparator selectively, the first non-inverted and inverted RF transmit signals produced by the transmission modulator can be supplied to a second differential input terminal of the phase comparator, in response to an event that a phase difference between input signals to the first and second differential input terminals of the phase comparator reaches the predetermined phase difference, a phase conversion output signal produced by the phase comparator is brought to a predetermined detection state, the controller executes a calibration action for reducing carrier leakage associated with the first modulator and a calibration action for reducing carrier leakage associated with the second modulator in response to a calibration instruction, in the calibration action for reducing carrier leakage associated with the first modulator, the first non-inverted and inverted local signals are supplied to the first differential input terminal of the phase comparator, whereas carrier signals leaking at first non-inverted and inverted RF transmit output terminals of the transmission modulator are supplied to the second differential input terminal of the phase comparator, in the calibration action for the first modulator, the controller keeps changing a ratio of DC biasing currents to the first and second transistors of the first modulator until the phase comparator produces the phase conversion output signal in the predetermined detection state, in the calibration action for the first modulator, the controller stops changing the ratio of DC biasing currents in the first modulator at a time when the phase comparator produces the phase conversion output signal in the predetermined detection state, in the calibration action for reducing carrier leakage associated with the second modulator, the second non-inverted and inverted local signals are supplied to the first differential input terminal of the phase comparator, whereas carrier signals leaking at the first non-inverted and inverted RF transmit output terminals of the transmission modulator are supplied to the second differential input terminal of the phase comparator, in the calibration action for the second modulator, the controller keeps changing a ratio of DC biasing currents to the seventh and eighth transistors of the second modulator until the phase comparator produces the phase conversion output signal in the predetermined detection state, and in the calibration action for the second modulator, the controller stops changing the ratio of DC biasing currents in the second modulator at a time when the phase comparator produces the phase conversion output signal in the predetermined detection state.

10. The transmitter according to claim 9, further comprising:

a first digital-to-analog converter; and a second digital-to-analog converter, wherein the first digital-to-analog converter is used to change the ratio of DC biasing currents to the first and second transistors of the first modulator, the second digital-to-analog converter is used to change the ratio of DC biasing currents to the seventh and eighth transistors of the second modulator, the controller includes a first control register for controlling the first digital-to-analog converter, and a second control register for controlling the second digital-to-analog converter, in an early stage of the calibration action for the first modulator, a digital value of the first control register of the controller is set to an initial value such that the DC biasing currents to the first and second transistors of the first modulator are substantially equalized to each other, in the calibration action for the first modulator, the controller keeps updating the digital value of the first control register until the phase comparator produces the phase conversion output signal in the predetermined detection state, and the controller stops updating the digital value of the first control register at a time when the phase comparator produces the phase conversion output signal in the predetermined detection state, in an early stage of the calibration action for the second modulator, a digital value of the second control register of the controller is set to an initial value such that the DC biasing currents to the seventh and eighth transistors of the second modulator are substantially equalized to each other, and in the calibration action of the second modulator, the controller keeps updating the digital value of the second control register until the phase comparator produces the phase conversion output signal in the predetermined detection state, and the controller stops updating the digital value of the second control register at a time when the phase comparator produces the phase conversion output signal in the predetermined detection state.

11. The transmitter according to claim 10, wherein the digital value of the first control register at the time when the controller stops updating the digital value of the first control register in the calibration action for the first modulator is a piece of control digital information which minimizes the carrier leakage associated with the first modulator, and the digital value of the second control register at the time when the controller stops updating the digital value of the second control register in the calibration action for the second modulator is a piece of control digital information which minimizes the carrier leakage associated with the second modulator.

12. The transmitter according to claim 11, wherein the phase comparator is composed of a double-balanced analog phase comparator circuit, the phase conversion output signal arising from a differential output terminal of the double-balanced analog phase comparator circuit is supplied to a differential input terminal of a voltage comparator, and a comparative output signal from the voltage comparator is supplied to the controller.

13. The Transmitter according to claim 11, further comprising:

a first limiter amplifier; and a second limiter amplifier, wherein the first non-inverted and inverted local signals, and the second non-inverted and inverted local signals are selectively supplied to a pair of differential input terminals of the first limiter amplifier, an output signal from a differential output terminal of the first limiter amplifier is transmitted to the first differential input terminal of the phase comparator, the leaked carrier signals arising at the output terminals of the transmission modulator are supplied to a pair of differential input terminals of the second limiter amplifier, and an output signal from a differential output terminal of the second limiter amplifier is transmitted to the second differential input terminal of the phase comparator.

14. The transmitter according to claim 11, further comprising:

a first delay regulator; and a second delay regulator, wherein the first delay regulator is connected between the pair of differential output terminals of the first limiter amplifier, and the first differential input terminal of the phase comparator, and the second delay regulator is connected between the pair of differential output terminals of the second limiter amplifier, and the second differential input terminal of the phase comparator.

15. The transmitter according to claim 11, wherein the predetermined phase difference is 90°, and the transmission modulator including the first and second modulators works as a quadrature modulator.

16. The transmitter according to claim 11, wherein the transmission modulator including the first and second modulators is of a type used for a transmitter based on a direct up-conversion (DUC) architecture, and the transmitter on the DUC architecture transmits an RF transmit signal according to at least one system of GSM850, GSM900, DCS1800, PCS1900, and Band1, Band2 and Band5 of WCDMA to a base station.

* * * * *